(12) United States Patent
Shionoiri et al.

(10) Patent No.: US 9,343,120 B2
(45) Date of Patent: May 17, 2016

(54) HIGH SPEED PROCESSING UNIT WITH NON-VOLATILE REGISTER

(71) Applicant: Semiconductor Energy Laboratory Co., Ltd., Atsugi-shi, Kanagawa-ken (JP)

(72) Inventors: Yutaka Shionoiri, Kanagawa (JP); Hidetomo Kobayashi, Kanagawa (JP); Yoshiyuki Kurokawa, Kanagawa (JP)

(73) Assignee: Semiconductor Energy Laboratory Co., Ltd., Atsugi-shi, Kanagawa-ken (JP)

( * ) Notice: Subject to any disclaimer, the term of this patent is extended or adjusted under 35 U.S.C. 154(b) by 239 days.

(21) Appl. No.: 13/904,383

(22) Filed: May 29, 2013

(65) Prior Publication Data

US 2013/0322187 A1 Dec. 5, 2013

(30) Foreign Application Priority Data

Jun. 1, 2012 (JP) ................................. 2012-125993
Jan. 24, 2013 (JP) ................................. 2013-010751

(51) Int. Cl.
*G11C 7/22* (2006.01)
*G11C 7/00* (2006.01)
*G11C 19/08* (2006.01)

(52) U.S. Cl.
CPC .............. *G11C 7/00* (2013.01); *G11C 19/0875* (2013.01)

(58) Field of Classification Search
CPC .... G11C 7/1036; G11C 7/106; G11C 7/1051; G11C 7/22; G11C 7/1006; G11C 8/06; G11C 8/04

USPC ............ 365/189.05, 189.08, 189.12, 230.08, 365/240, 239, 189.011, 154; 327/197, 198, 327/199, 200, 201, 202, 216, 217, 218

See application file for complete search history.

(56) References Cited

U.S. PATENT DOCUMENTS

| | | | | |
|---|---|---|---|---|
| 4,217,638 | A | * | 8/1980 | Namimoto et al. ........... 711/220 |
| 4,884,244 | A | * | 11/1989 | Brewer ......................... 365/240 |
| 5,731,856 | A | | 3/1998 | Kim et al. |
| 5,744,864 | A | | 4/1998 | Cillessen et al. |
| 6,148,376 | A | * | 11/2000 | Claassen ....................... 711/132 |
| 6,294,274 | B1 | | 9/2001 | Kawazoe et al. |

(Continued)

FOREIGN PATENT DOCUMENTS

| | | |
|---|---|---|
| EP | 1 737 044 A1 | 12/2006 |
| EP | 2 226 847 A2 | 9/2010 |

(Continued)

OTHER PUBLICATIONS

Patentariu et al., Some Considerations on 8-Level HDL Stack Implementation, May 27-29, 2004, 7th International Conference on Development and Application Systems.*

(Continued)

*Primary Examiner* — Alexander Sofocleous
*Assistant Examiner* — Alfredo Bermudez Lozada
(74) *Attorney, Agent, or Firm* — Fish & Richardson P.C.

(57) ABSTRACT

A semiconductor device in which the power consumption of a register is low is provided. Further, a processing unit whose operation speed is high and whose power consumption is low is provided. In the semiconductor device, a register operating at high speed and a nonvolatile FILO (first-in-last-out) register capable of reading and writing data from/to the register are provided.

16 Claims, 9 Drawing Sheets

(56) References Cited

U.S. PATENT DOCUMENTS

| | | |
|---|---|---|
| 6,563,174 B2 | 5/2003 | Kawasaki et al. |
| 6,727,522 B1 | 4/2004 | Kawasaki et al. |
| 7,049,190 B2 | 5/2006 | Takeda et al. |
| 7,061,014 B2 | 6/2006 | Hosono et al. |
| 7,064,346 B2 | 6/2006 | Kawasaki et al. |
| 7,105,868 B2 | 9/2006 | Nause et al. |
| 7,211,825 B2 | 5/2007 | Shih et al |
| 7,282,782 B2 | 10/2007 | Hoffman et al. |
| 7,297,977 B2 | 11/2007 | Hoffman et al. |
| 7,323,356 B2 | 1/2008 | Hosono et al. |
| 7,385,224 B2 | 6/2008 | Ishii et al. |
| 7,402,506 B2 | 7/2008 | Levy et al. |
| 7,411,209 B2 | 8/2008 | Endo et al. |
| 7,453,065 B2 | 11/2008 | Saito et al. |
| 7,453,087 B2 | 11/2008 | Iwasaki |
| 7,462,862 B2 | 12/2008 | Hoffman et al. |
| 7,468,304 B2 | 12/2008 | Kaji et al. |
| 7,501,293 B2 | 3/2009 | Ito et al. |
| 7,674,650 B2 | 3/2010 | Akimoto et al. |
| 7,732,819 B2 | 6/2010 | Akimoto et al. |
| 8,314,637 B2 | 11/2012 | Kato et al. |
| 8,362,538 B2 | 1/2013 | Koyama et al. |
| 8,410,838 B2 | 4/2013 | Kato et al. |
| 8,432,187 B2 | 4/2013 | Kato et al. |
| 2001/0046027 A1 | 11/2001 | Tai et al. |
| 2002/0056838 A1 | 5/2002 | Ogawa |
| 2002/0132454 A1 | 9/2002 | Ohtsu et al. |
| 2003/0189401 A1 | 10/2003 | Kido et al. |
| 2003/0218222 A1 | 11/2003 | Wager, III et al. |
| 2004/0038446 A1 | 2/2004 | Takeda et al. |
| 2004/0127038 A1 | 7/2004 | Carcia et al. |
| 2005/0017302 A1 | 1/2005 | Hoffman |
| 2005/0199959 A1 | 9/2005 | Chiang et al. |
| 2006/0035452 A1 | 2/2006 | Carcia et al. |
| 2006/0043377 A1 | 3/2006 | Hoffman et al. |
| 2006/0091793 A1 | 5/2006 | Baude et al. |
| 2006/0108529 A1 | 5/2006 | Saito et al. |
| 2006/0108636 A1 | 5/2006 | Sano et al. |
| 2006/0110867 A1 | 5/2006 | Yabuta et al. |
| 2006/0113536 A1 | 6/2006 | Kumomi et al. |
| 2006/0113539 A1 | 6/2006 | Sano et al. |
| 2006/0113549 A1 | 6/2006 | Den et al. |
| 2006/0113565 A1 | 6/2006 | Abe et al. |
| 2006/0169973 A1 | 8/2006 | Isa et al. |
| 2006/0170111 A1 | 8/2006 | Isa et al. |
| 2006/0197092 A1 | 9/2006 | Hoffman et al. |
| 2006/0208977 A1 | 9/2006 | Kimura |
| 2006/0228974 A1 | 10/2006 | Thelss et al. |
| 2006/0231882 A1 | 10/2006 | Kim et al. |
| 2006/0238135 A1 | 10/2006 | Kimura |
| 2006/0244107 A1 | 11/2006 | Sugihara et al. |
| 2006/0284171 A1 | 12/2006 | Levy et al. |
| 2006/0284172 A1 | 12/2006 | Ishii |
| 2006/0292777 A1 | 12/2006 | Dunbar |
| 2007/0024187 A1 | 2/2007 | Shin et al. |
| 2007/0046191 A1 | 3/2007 | Saito |
| 2007/0052025 A1 | 3/2007 | Yabuta |
| 2007/0054507 A1 | 3/2007 | Kaji et al. |
| 2007/0090365 A1 | 4/2007 | Hayashi et al. |
| 2007/0108446 A1 | 5/2007 | Akimoto |
| 2007/0152217 A1 | 7/2007 | Lai et al. |
| 2007/0172591 A1 | 7/2007 | Seo et al. |
| 2007/0187678 A1 | 8/2007 | Hirao et al. |
| 2007/0187760 A1 | 8/2007 | Furuta et al. |
| 2007/0194379 A1 | 8/2007 | Hosono et al. |
| 2007/0252928 A1 | 11/2007 | Ito et al. |
| 2007/0272922 A1 | 11/2007 | Kim et al. |
| 2007/0287296 A1 | 12/2007 | Chang |
| 2008/0006877 A1 | 1/2008 | Mardilovich et al. |
| 2008/0038882 A1 | 2/2008 | Takechi et al. |
| 2008/0038929 A1 | 2/2008 | Chang |
| 2008/0050595 A1 | 2/2008 | Nakagawara et al. |
| 2008/0073653 A1 | 3/2008 | Iwasaki |
| 2008/0083950 A1 | 4/2008 | Pan et al. |
| 2008/0106191 A1 | 5/2008 | Kawase |
| 2008/0128689 A1 | 6/2008 | Lee et al. |
| 2008/0129195 A1 | 6/2008 | Ishizaki et al. |
| 2008/0166834 A1 | 7/2008 | Kim et al. |
| 2008/0182358 A1 | 7/2008 | Cowdery-Corvan et al. |
| 2008/0224133 A1 | 9/2008 | Park et al. |
| 2008/0254569 A1 | 10/2008 | Hoffman et al. |
| 2008/0258139 A1 | 10/2008 | Ito et al. |
| 2008/0258140 A1 | 10/2008 | Lee et al. |
| 2008/0258141 A1 | 10/2008 | Park et al. |
| 2008/0258143 A1 | 10/2008 | Kim et al. |
| 2008/0296568 A1 | 12/2008 | Ryu et al. |
| 2009/0068773 A1 | 3/2009 | Lai et al. |
| 2009/0073325 A1 | 3/2009 | Kuwabara et al. |
| 2009/0114910 A1 | 5/2009 | Chang |
| 2009/0134399 A1 | 5/2009 | Sakakura et al. |
| 2009/0152506 A1 | 6/2009 | Umeda et al. |
| 2009/0152541 A1 | 6/2009 | Maekawa et al. |
| 2009/0278122 A1 | 11/2009 | Hosono et al. |
| 2009/0280600 A1 | 11/2009 | Hosono et al. |
| 2010/0065844 A1 | 3/2010 | Tokunaga |
| 2010/0092800 A1 | 4/2010 | Itagaki et al. |
| 2010/0109002 A1 | 5/2010 | Itagaki et al. |
| 2011/0101351 A1 | 5/2011 | Yamazaki |
| 2011/0102018 A1 | 5/2011 | Shionoiri et al. |
| 2011/0121878 A1 | 5/2011 | Kato et al. |
| 2011/0147737 A1 | 6/2011 | Yamazaki et al. |
| 2011/0148463 A1 | 6/2011 | Kato et al. |
| 2011/0187410 A1 | 8/2011 | Kato et al. |
| 2011/0249487 A1 | 10/2011 | Saito et al. |
| 2011/0254523 A1 | 10/2011 | Ito et al. |
| 2012/0033510 A1 | 2/2012 | Nagatsuka et al. |
| 2012/0049889 A1 | 3/2012 | Hatano |
| 2012/0140550 A1* | 6/2012 | Endo et al. .......... 365/149 |
| 2012/0170355 A1 | 7/2012 | Ohmaru et al. |
| 2012/0195122 A1 | 8/2012 | Ohmaru |
| 2012/0230078 A1 | 9/2012 | Fujita |
| 2012/0292680 A1 | 11/2012 | Nagatsuka et al. |

FOREIGN PATENT DOCUMENTS

| | | |
|---|---|---|
| JP | 60-198861 A | 10/1985 |
| JP | 63-210022 A | 8/1988 |
| JP | 63-210023 A | 8/1988 |
| JP | 63-210024 A | 8/1988 |
| JP | 63-215519 A | 9/1988 |
| JP | 63-239117 A | 10/1988 |
| JP | 63-265818 A | 11/1988 |
| JP | 05-251705 A | 9/1993 |
| JP | 08-264794 A | 10/1996 |
| JP | 11-505377 A | 5/1999 |
| JP | 2000-044236 A | 2/2000 |
| JP | 2000-150900 A | 5/2000 |
| JP | 2002-076356 A | 3/2002 |
| JP | 2002-289859 A | 10/2002 |
| JP | 2003-086000 A | 3/2003 |
| JP | 2003-086808 A | 3/2003 |
| JP | 2004-103957 A | 4/2004 |
| JP | 2004-273614 A | 9/2004 |
| JP | 2004-273732 A | 9/2004 |
| JP | 2011-151377 A | 8/2011 |
| WO | 2004/114391 A1 | 12/2004 |
| WO | 2011-074392 A1 | 6/2011 |

OTHER PUBLICATIONS

Asakuma, N et al., "Crystallization and Reduction of Sol-Gel-Derived Zinc Oxide Films by Irradiation with Ultraviolet Lamp," Journal of Sol-Gel Science and Technology, 2003, vol. 26, pp. 181-184.

Asaoka, Y et al., "29.1: Polarizer-Free Reflective LCD Combined with Ultra Low-Power Driving Technology," SID Digest '09 : SID International Symposium Digest of Technical Papers, 2009, pp. 395-398.

Chern, H et al., "An Analytical Model for the Above-Threshold Characteristics of Polysilicon Thin-Film Transistors," IEEE Transactions on Electron Devices, Jul. 1, 1995, vol. 42, No. 7, pp. 1240-1246.

(56) References Cited

OTHER PUBLICATIONS

Cho, D et al., "21.2: Al and Sn-Doped Zinc Indium Oxide Thin Film Transistors for AMOLED Back-Plane," SID Digest '09 : SID International Symposium Digest of Technical Papers, May 31, 2009, pp. 280-283.

Clark, S et al., "First Principles Methods Using CASTEP" Zeitschrift fur Kristallographie, 2005, vol. 220, pp. 567-570.

Coates. D et al., "Optical Studies of the Amorphous Liquid-Cholesteric Liquid Crystal Transition: The Blue Phase," Physics Letters, Sep. 10, 1973, vol. 45A, No. 2, pp. 115-116.

Costello, M et al., "Electron Microscopy of a Cholesteric Liquid Crystal and Its Blue Phase," Phys. Rev. A (Physical Review. A), May 1, 1984, vol. 29, No. 5, pp. 2957-2959.

Dembo, H et al., "RFCPUS on Glass and Plastic Substrates Fabricated by TFT Transfer Technology," IEDM 05: Technical Digest of International Electron Devices Meeting, Dec. 5, 2005, pp. 1067-1069.

Fortunato, E et al., "Wide-Bandgap High-Mobility ZNO Thin-Film Transistors Produced at Room Temperature," Appl. Phys. Lett. (Applied Physics Letters), Sep. 27, 2004, vol. 85, No. 13, pp. 2541-2543.

Fung, T et al., "2-D Numerical Simulation of High Performance Amorphous In—Ga—Zn—O TFTs for Flat Panel Displays," AM-FPD '08 Digest of Technical Papers, Jul. 2, 2008, pp. 251-252, The Japan Society of Applied Physics.

Godo, H et al., "P-9: Numerical Analysis on Temperature Dependence of Characteristics of Amorphous In—Ga—Zn—Oxide TFT," SID Digest '09 : SID International Symposium Digest of Technical Papers, May 31, 2009, pp. 1110-1112.

Godo, H et al., "Temperature Dependence of Characteristics and Electronic Structure for Amorphous In—Ga—Zn—Oxide TFT," AM-FPD '09 Digest of Technical Papers, Jul. 1, 2009, pp. 41-44.

Hayashi, R et al., "42.1: Invited Paper: Improved Amorphous In—Ga—Zn—O TFTs," SID Digest '08 : SID International Symposium Digest of Technical Papers, May 20, 2008, vol. 39, pp. 621-624.

Hirao, T et al., "Novel Top-Gate Zinc Oxide Thin-Film Transistors (ZNO TFTs) for AMLCDs," Journal of the SID , 2007, vol. 15, No. 1, pp. 17-22.

Hosono, H et al., "Working hypothesis to explore novel wide band gap electrically conducting amorphous oxides and examples," J. Non-Cryst. Solids (Journal of Non-Crystalline Solids), 1996, vol. 198-200, pp. 165-169.

Hosono, H, "68.3: Invited Paper:Transparent Amorphous Oxide Semiconductors for High Performance TFT," SID Digest '07 : SID International Symposium Digest of Technical Papers, 2007, vol. 38, pp. 1830-1833.

Hsieh, H et al., "P-29: Modeling of Amorphous Oxide Semiconductor Thin Film Transistors and Subgap Density of States," SID Digest '08 : SID International Symposium Digest of Technical Papers, 2008, vol. 39, pp. 1277-1280.

Ikeda, T et al., "Full-Functional System Liquid Crystal Display Using CG-Silicon Technology," SID Digest '04 : SID International Symposium Digest of Technical Papers, 2004, vol. 35, pp. 860-863.

Janotti, A et al., "Native Point Defects in ZnO," Phys. Rev. B (Physical Review. B), 2007, vol. 76, No. 16, pp. 165202-1-165202-22.

Janotti, A et al., "Oxygen Vacancies in ZnO," Appl. Phys. Lett. (Applied Physics Letters), 2005, vol. 87, pp. 122102-1-122102-3.

Jeong, J et al., "3.1: Distinguished Paper: 12.1-Inch WXGA AMOLED Display Driven by Indium—Gallium—Zinc Oxide TFTs Array," SID Digest '08 : SID International Symposium Digest of Technical Papers, May 20, 2008, vol. 39, No. 1, pp. 1-4.

Jin, D et al., "65.2: Distinguished Paper:World-Largest (6.5") Flexible Full Color Top Emission AMOLED Display on Plastic Film and Its Bending Properties," SID Digest '09 : SID International Symposium Digest of Technical Papers, May 31, 2009, pp. 983-985.

Kanno, H et al., "White Stacked Electrophosphorecent Organic Light-Emitting Devices Employing MOO3 as a Charge-Generation Layer," Adv. Mater. (Advanced Materials), 2006, vol. 18, No. 3, pp. 339-342.

Kikuchi, H et al., "39.1: Invited Paper: Optically Isotropic Nano-Structured Liquid Crystal Composites for Display Applications," SID Digest '09 : SID International Symposium Digest of Technical Papers, May 31, 2009, pp. 578-581.

Kikuchi, H et al., "62.2: Invited Paper: Fast Electro-Optical Switching in Polymer-Stabilized Liquid Crystalline Blue Phases for Display Application," SID Digest '07 : SID International Symposium Digest of Technical Papers, 2007, vol. 38, pp. 1737-1740.

Kikuchi, H et al., "Polymer-Stabilized Liquid Crystal Blue Phases," Nature Materials, Sep. 1, 2002, vol. 1, pp. 64-68.

Kim, S et al., "High-Performance oxide thin film transistors passivated by various gas plasmas," The Electrochemical Society, 214th ECS Meeting, 2008, No. 2317, 1 page.

Kimizuka, N et al., "Spinel,YBFE2O4, and YB2FE3O7 Types of Structures for Compounds in the In2O3 and SC2O3—A2O3—BO Systems [A; Fe, Ga, or Al; B: Mg, Mn, Fe, Ni, Cu,or Zn] at Temperatures Over 1000° C.," Journal of Solid State Chemistry, 1985, vol. 60, pp. 382-384.

Kimizuka, N et al., "Syntheses and Single-Crystal Data of Homologous Compounds, In2O3(ZnO)m (m=3, 4, and 5), InGaO3(ZnO)3, and Ga2O3(ZnO)m (m=7, 8, 9, and 16) in the In2O3—ZnGa2O4—ZnO System," Journal of Solid State Chemistry, Apr. 1, 1995, vol. 116, No. 1, pp. 170-178.

Kitzerow, H et al., "Observation of Blue Phases in Chiral Networks," Liquid Crystals, 1993, vol. 14, No. 3, pp. 911-916.

Kurokawa, Y et al., "UHF RFCPUS on Flexible and Glass Substrates for Secure RFID Systems," Journal of Solid-State Circuits , 2008, vol. 43, No. 1, pp. 292-299.

Lany, S et al., "Dopability, Intrinsic Conductivity, and Nonstoichiometry of Transparent Conducting Oxides," Phys. Rev. Lett. (Physical Review Letters), Jan. 26, 2007, vol. 98, pp. 045501-1-045501-4.

Lee, H et al., "Current Status of, Challenges to, and Perspective View of AM-OLED," IDW '06 : Proceedings of the 13th International Display Workshops, Dec. 7, 2006, pp. 663-666.

Lee, J et al., "World's Largest (15-Inch) XGA AMLCD Panel Using IGZO Oxide TFT," SID Digest '08 : SID International Symposium Digest of Technical Papers, May 20, 2008, vol. 39, pp. 625-628.

Lee, M et al., "15.4: Excellent Performance of Indium—Oxide-Based Thin-Film Transistors by DC Sputtering," SID Digest '09 : SID International Symposium Digest of Technical Papers, May 31, 2009, pp. 191-193.

Li C et al., "Modulated Structures of Homologous Compounds InMO3(ZnO)m (M=In,Ga; m=Integer) Described by Four-Dimensional Superspace Group," Journal of Solid State Chemistry, 1998, vol. 139, pp. 347-355.

Masuda, S et al., "Transparent thin film transistors using ZnO as an active channel layer and their electrical properties," J. Appl. Phys. (Journal of Applied Physics), Feb. 1, 2003, vol. 93, No. 3, pp. 1624-1630.

Meiboom, S et al., "Theory of the Blue Phase of Cholesteric Liquid Crystals," Phys. Rev. Lett. (Physical Review Letters), May 4, 1981, vol. 46, No. 18, pp. 1216-1219.

Miyasaka, M, "SUFTLA Flexible Microelectronics on their Way to Business," SID Digest '07 : SID International Symposium Digest of Technical Papers, 2007, vol. 38, pp. 1673-1676.

Mo, Y et al., "Amorphous Oxide TFT Backplanes for Large Size AMOLED Displays," IDW '08 : Proceedings of the 6th International Display Workshops, Dec. 3, 2008, pp. 581-584.

Nakamura, "Synthesis of Homologous Compound with New Long-Period Structure," NIRIM Newsletter, Mar. 1995, vol. 150, pp. 1-4 with English translation.

Nakamura, M et al., "The phase relations in the In2O3—Ga2ZnO4—ZnO system at 1350° C.," Journal of Solid State Chemistry, Aug. 1, 1991, vol. 93, No. 2, pp. 298-315.

Nomura, K et al., "Thin-Film Transistor Fabricated in Single-Crystalline Transparent Oxide Semiconductor," Science, May 23, 2003, vol. 300, No. 5623, pp. 1269-1272.

Nomura, K et al., "Amorphous Oxide Semiconductors for High-Performance Flexible Thin-Film Transistors," JPN. J. Appl. Phys. (Japanese Journal of Applied Physics) , 2006, vol. 45, No. 5B, pp. 4303-4308.

(56) References Cited

OTHER PUBLICATIONS

Nomura, K et al., "Room-Temperature Fabrication of Transparent Flexible Thin-Film Transistors Using Amorphous Oxide Semiconductors," Nature, Nov. 25, 2004, vol. 432, pp. 488-492.

Nomura, K et al., "Carrier transport in transparent oxide semiconductor with intrinsic structural randomness probed using single-crystalline InGaO3(ZnO)5 films," Appl. Phys. Lett. (Applied Physics Letters), Sep. 13, 2004, vol. 85, No. 11, pp. 1993-1995.

Nowatari, H et al., "60.2: Intermediate Connector with Suppressed Voltage Loss for White Tandem OLEDs," SID Digest '09 : SID International Symposium Digest of Technical Papers, May 31, 2009, vol. 40, pp. 899-902.

Oba, F et al., "Defect energetics in ZnO: A hybrid Hartree-Fock density functional study," Phys. Rev. B (Physical Review. B), 2008, vol. 77, pp. 245202-1-245202-6.

Oh, M et al., "Improving the Gate Stability of ZNO Thin-Film Transistors with Aluminum Oxide Dielectric Layers," J. Electrochem. Soc. (Journal of the Electrochemical Society), 2008, vol. 155, No. 12, pp. H1009-H1014.

Ohara, H et al., "21.3: 4.0 In. QVGA AMOLED Display Using In—Ga—Zn—Oxide TFTs with a Novel Passivation Layer," SID Digest '09 : SID International Symposium Digest of Technical Papers, May 31, 2009, pp. 284-287.

Ohara, H et al., "Amorphous In—Ga—Zn—Oxide TFTs with Suppressed Variation for 4.0 inch QVGA AMOLED Display," AM-FPD '09 Digest of Technical Papers, Jul. 1, 2009, pp. 227-230, The Japan Society of Applied Physics.

Orita, M et al., "Amorphous transparent conductive oxide InGaO3(ZnO)m (m<4):a Zn4s conductor," Philosophical Magazine, 2001, vol. 81, No. 5, pp. 501-515.

Orita, M et al., "Mechanism of Electrical Conductivity of Transparent InGaZnO4," Phys. Rev. B (Physical Review. B), Jan. 15, 2000, vol. 61, No. 3, pp. 1811-1816.

Osada, T et al., "15.2: Development of Driver-Integrated Panel using Amorphous In—Ga—Zn—Oxide TFT," SID Digest '09 : SID International Symposium Digest of Technical Papers, May 31, 2009, pp. 184-187.

Osada, T et al., "Development of Driver-Integrated Panel Using Amorphous In—Ga—Zn—Oxide TFT," AM-FPD '09 Digest of Technical Papers, Jul. 1, 2009, pp. 33-36.

Park, J et al., "Dry etching of ZnO films and plasma-induced damage to optical properties," J. Vac. Sci. Technol. B (Journal of Vacuum Science & Technology B), Mar. 1, 2003, vol. 21, No. 2, pp. 800-803.

Park, J et al., "Improvements in the Device Characteristics of Amorphous Indium Gallium Zinc Oxide Thin-Film Transistors by Ar Plasma Treatment," Appl. Phys. Lett. (Applied Physics Letters), Jun. 26, 2007, vol. 90, No. 26, pp. 262106-1-262106-3.

Park, J et al., "Electronic Transport Properties of Amorphous Indium—Gallium—Zinc Oxide Semiconductor Upon Exposure to Water," Appl. Phys. Lett. (Applied Physics Letters), 2008, vol. 92, pp. 072104-1-072104-3.

Park, J et al., "High performance amorphous oxide thin film transistors with self-aligned top-gate structure," IEDM 09: Technical Digest of International Electron Devices Meeting, Dec. 7, 2009, pp. 191-194.

Park, Sang-Hee et al., "42.3: Transparent ZnO Thin Film Transistor for the Application of High Aperture Ratio Bottom Emission AM-OLED Display," SID Digest '08 : SID International Symposium Digest of Technical Papers, May 20, 2008, vol. 39, pp. 629-632.

Park, J et al., "Amorphous Indium—Gallium—Zinc Oxide TFTs and Their Application for Large Size AMOLED," AM-FPD '08 Digest of Technical Papers, Jul. 2, 2008, pp. 275-278.

Park, S et al., "Challenge to Future Displays: Transparent AM-OLED Driven by Peald Grown ZNO TFT," IMID '07 Digest, 2007, pp. 1249-1252.

Prins, M et al., "A Ferroelectric Transparent Thin-Film Transistor," Appl. Phys. Lett. (Applied Physics Letters), Jun. 17, 1996, vol. 68, No. 25, pp. 3650-3652.

Sakata, J et al., "Development of 4.0-In. AMOLED Display with Driver Circuit Using Amorphous In—Ga—Zn—Oxide TFTs," IDW '09 : Proceedings of the 16th International Display Workshops, 2009, pp. 689-692.

Son, K et al., "42.4L: Late-News Paper: 4 Inch QVGA AMOLED Driven by the Threshold Voltage Controlled Amorphous GIZO (Ga2O3—In2O3—ZnO) TFT," SID Digest '08 : SID International Symposium Digest of Technical Papers, May 20, 2008, vol. 39, pp. 633-636.

Takahashi, M et al., "Theoretical Analysis of IGZO Transparent Amorphous Oxide Semiconductor," IDW '08 : Proceedings of the 15th International Display Workshops, Dec. 3, 2008, pp. 1637-1640.

Tsuda, K et al., "Ultra Low Power Consumption Technologies for Mobile TFT-LCDs," IDW '02 : Proceedings of the 9th International Display Workshops, Dec. 4, 2002, pp. 295-298.

Ueno, K et al., "Field-effect Transistor on SrTiO3 with sputtered Al2O3 Gate Insulator," Appl. Phys. Lett. (Applied Physics Letters), Sep. 1, 2003, vol. 83, No. 9, pp. 1755-1757.

Van De Walle, C, "Hydrogen as a Cause of Doping in Zinc Oxide," Phys. Rev. Lett. (Physical Review Letters), Jul. 31, 2000, vol. 85, No. 5, pp. 1012-1015.

\* cited by examiner

HIGH SPEED PROCESSING UNIT WITH NON-VOLATILE REGISTER

BACKGROUND OF THE INVENTION

1. Field of the Invention

The present invention relates to an object, a method, or a manufacturing method. Further, the present invention relates to a process, a machine, manufacture, or a composition of matter. In particular, the present invention relates to, for example, a semiconductor device, a display device, a light-emitting device, a power storage device, a driving method thereof, or a manufacturing method thereof. In particular, the present invention relates to a semiconductor device including a register and a processing unit including the semiconductor device.

2. Description of the Related Art

The processing speed of a processing unit is significantly affected by the speed at which an arithmetic portion accesses data (the speed of reading operation and writing operation). For that reason, the processing unit is provided with a memory circuit called a register, which operates at high speed.

The arithmetic portion needs to execute an interrupt instruction in some cases. When the arithmetic portion executes an interrupt instruction, data in the register is temporarily stored in another memory circuit so that another data can be written to the register before the interrupt instruction is executed. After the interrupt instruction is executed, the stored data is restored to the register. The memory circuit in which data in the register can be temporarily stored is called a stack register, and is provided in the processing unit.

Note that the processing unit includes not only the arithmetic portion and the memory portion but also a control portion, a transmission path (also referred to as a bus), and the like. The control portion controls components of the processing unit, and the transmission path is a common signal line connecting the components. The transmission path is used when data is transferred between the register and the stack register, for example.

A semiconductor device that can hold stored data even without power supply and has an unlimited number of write cycles has been known (Patent Document 1).

REFERENCE

Patent Document

[Patent Document 1] Japanese Published Patent Application No. 2011-151377

SUMMARY OF THE INVENTION

With an enriched infrastructure of the information communication means, an improvement in the information-processing capability and an increase in the continuous operation time of a portable information terminal have been strongly requested. Also in terms of energy problems, a reduction in the power consumption of a processing unit has been requested.

In order to improve the processing speed of a processing unit, a memory circuit needs to be provided such that access to data in an arithmetic portion is easy. For example, the number of registers (in other words, the memory capacity of the memory circuit) is increased.

However, it has been difficult to increase the memory capacity of the register while power consumption is reduced because most memory circuits operating at high speed are volatile and thus consume power constantly for storing data.

One embodiment of the present invention has been made in view of the foregoing technical background. Therefore, an object is to provide a semiconductor device in which the power consumption of a register is low. Another object is to provide a processing unit whose operation speed is high and whose power consumption is low.

Note that the descriptions of these objects do not preclude the existence of other objects. Note that one embodiment of the present invention does not necessarily achieve all the objects listed above. Other objects will be apparent from and can be derived from the description of the specification, the drawings, the claims, and the like.

In order to solve the above problem, one embodiment of the present invention has been made with a focus on the structure of a semiconductor device including a register. The present inventors conceived a semiconductor device which includes a register operating at high speed and a nonvolatile first-in-last-out (FILO) register that can read and write data to/from the register. Note that in this specification, the term "nonvolatile" means a property of maintaining stored data even when power supply is stopped, and the term "volatile" means a property of erasing stored data instantly when power supply is stopped.

One embodiment of the present invention is a semiconductor device including a register to which data can be written through a first transmission path and from which the data can be read out to the first transmission path or a second transmission path; a reading/writing circuit which writes data read out from the second transmission path to the first transmission path; and a nonvolatile FILO register. The nonvolatile FILO register operates in a first mode in which data is written through the second transmission path to the nonvolatile FILO register and a second mode in which data stored in the nonvolatile FILO register is read out to the second transmission path.

Note that in this specification, an FILO register and a first-in-first-out (FIFO) register each mean a register that can store a plurality of pieces of data sequentially. The FILO register can read out a plurality of pieces of data in the order which is the reverse of the order of storing them; specifically, four pieces of data, A, B, C, and D, which are stored in this order can be read out in the order of D, C, B, and A. On the other hand, the FIFO register can read out a plurality of pieces of data in the order of storing them; specifically, four pieces of data, A, B, C, and D, which are stored in this order can be read out in the order of A, B, C, and D.

That is, one embodiment of the present invention is a semiconductor device including: a register electrically connected to a first transmission path and a second transmission path; a reading/writing circuit electrically connected to the first transmission path and the second transmission path; a nonvolatile FILO register electrically connected to the second transmission path; a control circuit configured to control the nonvolatile FILO register; and a control signal line electrically connecting the nonvolatile FILO register and the control circuit.

Data is written to the register through the first transmission path, and data stored in the register is read out to the first transmission path or the second transmission path.

The reading/writing circuit is configured to write data read from the second transmission path to the first transmission path.

The nonvolatile FILO register operates in a first mode in which data is written through the second transmission path to the nonvolatile FILO register and a second mode in which data stored in the nonvolatile FILO register is read out to the second transmission path.

The control circuit outputs a mode control signal through the control signal line to switch the first mode and the second mode of the nonvolatile FILO register.

With such a structure, data written to the register can be stored in the nonvolatile FILO register. Since the power consumption of the nonvolatile FILO register in a standby state is low, the memory capacity of the nonvolatile FILO register can be increased while the power consumption of the semiconductor device is reduced. Note that data can be transferred between the register and the nonvolatile FILO register through the second transmission path even when the first transmission path transfers another data. As a result, the semiconductor device including the register whose power consumption is low and from which data can be stored at high speed can be provided.

Another embodiment of the present invention is a semiconductor device having the above structure. The nonvolatile FILO register includes a plurality of nonvolatile flip-flop circuits. Each of the plurality of nonvolatile flip-flop circuits includes: a first terminal; a second terminal; a first control terminal electrically connected to a first control signal line functioning as the control signal line; and a second control terminal electrically connected to a second control signal line functioning as the control signal line. The first terminal functions as an input terminal and the second terminal functions as an output terminal in response to a first mode control signal input to the first control terminal, and the first terminal functions as the output terminal and the second terminal functions as the input terminal in response to a second mode control signal. Stored first data is output to the output terminal and second data is input from the input terminal in response to a clock signal input to the second control terminal in a state where power is supplied. Stored data is held in a state where power is not supplied.

The semiconductor device of one embodiment of the present invention includes a plurality of nonvolatile flip-flop circuits in which the first control terminals are connected in parallel with the first control signal line and the second control terminals are connected in parallel with the second control signal line. In each of the flip-flop circuits, the input terminal and the output terminal are interchanged with each other in response to the mode control signal input from the control circuit through the first control signal line. The nonvolatile flip-flop circuits are connected in series with respect to the second transmission path. The nonvolatile FILO register is formed in this manner.

Accordingly, by a reduction in the number of kinds of control signals, the structure of the control circuit can be simplified, and an increase in the number of the control signal lines and an increase in the area occupied by the control circuit or wirings including the control signal lines can be prevented. As a result, the manufacturing process can be simplified, the capacity of the nonvolatile FILO register can be increased, or a signal delay due to an increase in the wiring capacitance can be prevented. Further, a semiconductor device including the register whose power consumption is low and from which data can be stored at high speed can be provided.

Another embodiment of the present invention is a semiconductor device having the above structure. The nonvolatile FILO register includes a nonvolatile flip-flop circuit. The nonvolatile flip-flop circuit includes: a first component circuit, a second component circuit, a third component circuit, and a fourth component circuit each including an A terminal, a B terminal, a C terminal, a D terminal, and an E terminal. The A terminal and the B terminal are in a high impedance state when a low potential is input to the D terminal and a high potential is input to the E terminal. A signal is output to the B terminal in accordance with a signal input from the A terminal when the high potential is input to the C terminal and the D terminal and the low potential is input to the E terminal.

The nonvolatile flip-flop circuit further includes: a first capacitor one terminal of which is connected to the B terminal of the first component circuit, the A terminal of the second component circuit, the B terminal of the third component circuit, and the A terminal of the fourth component circuit, and the other terminal of which is grounded; and a second capacitor one terminal of which is connected to the B terminal of the second component circuit and the A terminal of the third component circuit, and the other terminal of which is grounded.

The nonvolatile flip-flop circuit further includes: a first control terminal connected to the D terminal of the first component circuit, the D terminal of the second component circuit, the E terminal of the third component circuit, and the E terminal of the fourth component circuit; and a second control circuit connected to the C terminal of the first component circuit and the C terminal of the third component circuit.

The nonvolatile flip-flop circuit further includes: a first inverter circuit an input terminal of which is connected to the first control terminal; and a second inverter circuit an input terminal of which is connected to the second control terminal.

The nonvolatile flip-flop circuit further includes: a first terminal connected to the A terminal of the first component circuit and the B terminal of the fourth component circuit; and a second terminal connected to the B terminal of the second component circuit and the A terminal of the third component circuit.

The E terminal of the first component circuit, the E terminal of the second component circuit, the D terminal of the third component circuit, and the D terminal of the fourth component circuit are connected to an output terminal of the first inverter circuit. The C terminal of the second component circuit and the C terminal of the fourth component circuit are connected to an output terminal of the second inverter circuit.

Another embodiment of the present invention is a semiconductor device having the above structure. Each of the component circuits in nonvolatile flip-flop circuit in the nonvolatile FILO register includes: a three-state buffer; a switching transistor a first electrode of which is connected to an output terminal of the three-state buffer; an A terminal connected to an input terminal of the three-state buffer; a B terminal connected to a second electrode of the switching transistor; a C terminal connected to a gate electrode of the switching transistor; a D terminal connected to a mode control signal terminal of the three-state buffer; and an E terminal connected to an inverted mode control signal terminal of the three-state buffer.

A channel formation region of the switching transistor includes a semiconductor having a wider band gap and low intrinsic carrier density than silicon.

The nonvolatile flip-flop circuit included in the nonvolatile FILO register in the semiconductor device of one embodiment of the present invention includes a storage node connected to the first capacitor. The nonvolatile flip-flop circuit stores data input to the input terminal and outputs data stored in the nonvolatile flip-flop circuit in response to the clock signal input to the second control terminal. The input terminal and the output terminal are interchanged in response to the mode control signal input to the first control terminal. The inverter circuit connected to each control terminal generates an inverted signal inside the inverter circuit.

From the above, by providing a plurality of flip-flop circuits connected to the two control signal lines, the capacity of the nonvolatile FILO register can be increased. As a result, a semiconductor device in which an increase in the area occupied by a control circuit or wirings is suppressed, in which a signal delay due to an increase in wiring capacitance, and which can be manufactured easily can be provided. The semiconductor device includes a register whose power consumption is low and from which data can be stored at high speed.

The storage node is connected to the second electrode of the switching transistor whose leakage current in an off state is extremely small and the high impedance input terminal of the three-state buffer.

Consequently, the leakage current of the switching transistor in an off state can be extremely small, and data in the storage node can be held for a long time even when power supply is stopped (in other words, power gating is performed). Further, driving voltage can be reduced and an increase in power consumption can be suppressed in comparison with a structure where electric charge is held in a storage node with the use of a transistor having a floating gate, for example.

Another embodiment of the present invention is a semiconductor device having the above structure. The semiconductor device further includes a memory access determination circuit. The memory access determination circuit outputs a wait signal in a period during which data is written to the nonvolatile FILO register.

Since the semiconductor device of one embodiment of the present invention includes the memory access determination circuit, a failure in which, before writing data read from the register to the nonvolatile FILO register is finished, another data is written to the register can be prevented. As a result, a semiconductor device with less malfunction, high reliability, and low power consumption, which includes a register from which data can be stored at high speed, can be provided.

Another embodiment of the present invention is a semiconductor device having the above structure. The nonvolatile FILO register includes: a nonvolatile external memory device; and a nonvolatile FIFO register including a first input/output terminal electrically connected to the second transmission path and a second input/output terminal connected to the external memory device.

The nonvolatile FIFO register operates in a first mode and a second mode. In the first mode, data is written to the nonvolatile FIFO register from the first input/output terminal and the oldest data input from the first input/output terminal is read out to the second input/output terminal.

Data read from the second input/output terminal of the nonvolatile FIFO register is written to the external memory device.

In the second mode, the latest data input to the nonvolatile FIFO register from the first input/output terminal is read out to the first input/output terminal and data is written to the nonvolatile FIFO from the second input/output terminal.

Data read by the external memory device is input from the second input/output terminal of the nonvolatile FIFO register.

Since the nonvolatile FILO register in the semiconductor device of one embodiment of the present invention includes the nonvolatile external memory device and the nonvolatile FIFO register electrically connected to the external memory device, the capacity of the nonvolatile FILO register can be made significantly large. As a result, there is no possibility of an overflow of the FILO register; thus, a semiconductor device with high reliability and low power consumption, which includes the register from which data can be stored at high speed, can be provided.

According to one embodiment of the present invention, a semiconductor device including a register whose power consumption is low can be provided. Further, a processing unit whose operation speed is high and whose power consumption is low can be provided.

DETAILED DESCRIPTION OF THE INVENTION

Figure 1A:
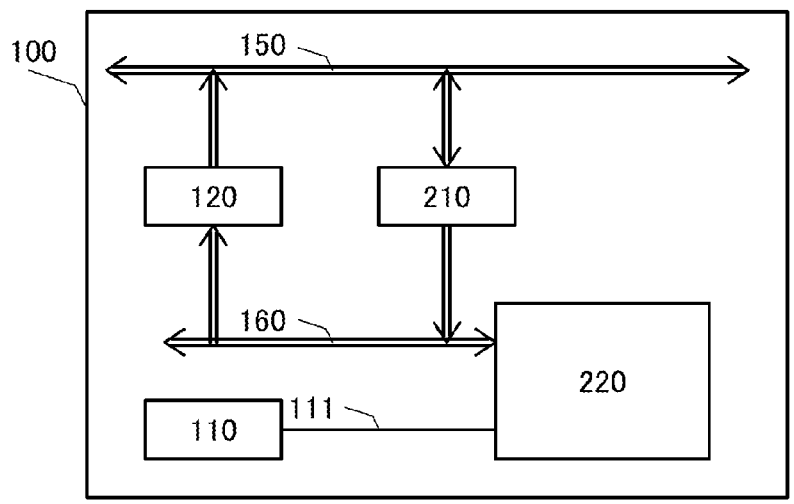
FIGS. 1A to 1C are block diagrams each illustrating the structure of a semiconductor device of an embodiment.

Embodiments will be described in detail with reference to the accompanying drawings. Note that the present invention is not limited to the following description, and it will be easily understood by those skilled in the art that various changes and modifications can be made without departing from the spirit and scope of the present invention. Therefore, the present invention should not be construed as being limited to the description in the following embodiments. In the structures described below, the same portions or portions having similar functions are denoted by the same reference numerals in different drawings, and explanation thereof will not be repeated.

Embodiment 1

Figure 1B:
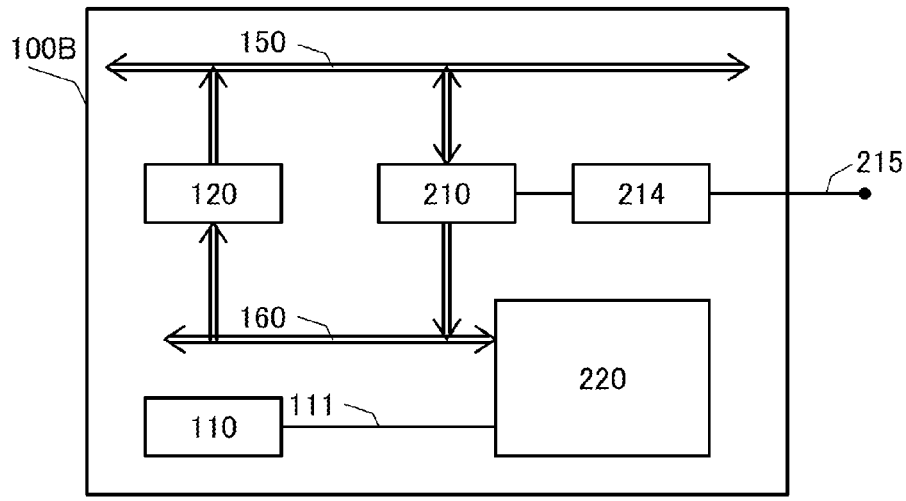
Figure 1C:
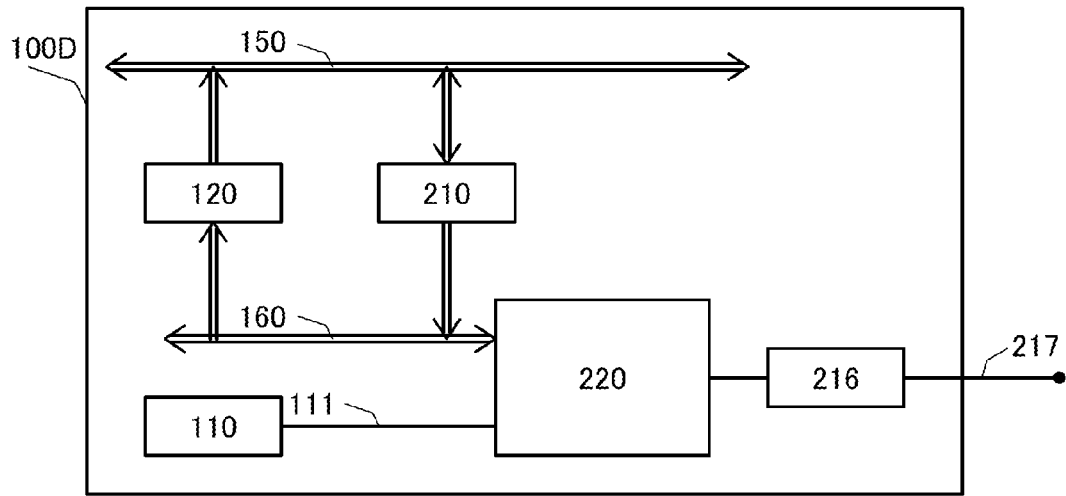

In this embodiment, the structure of a semiconductor device of one embodiment of the present invention will be described with reference to FIGS. 1A to 1C. FIG. 1A is a block diagram illustrating the structure of a semiconductor device of one embodiment of the present invention, FIG. 1B is a block diagram illustrating the structure of a semiconductor device of another embodiment of the present invention, and FIG. 1C is a block diagram illustrating the structure of a semiconductor device of yet another embodiment of the present invention.

The semiconductor device illustrated in FIG. 1A includes a register 210 electrically connected to a first transmission path 150 and a second transmission path 160, a reading/writing circuit 120 electrically connected to the first transmission path 150 and the second transmission path 160, a nonvolatile FILO register 220 electrically connected to the second transmission path 160, a control circuit 110 controlling the nonvolatile FILO register 220, and a control signal line 111 electrically connecting the nonvolatile FILO register 220 and the control circuit 110.

To the register 210, data can be written through the first transmission path 150. Further, data stored in the register 210 can be read out to the first transmission path 150 or the second transmission path 160.

By the reading/writing circuit 120, data read out from the second transmission path 160 can be written to the first transmission path 150.

The nonvolatile FILO register 220 operates in a first mode in which data is written to the nonvolatile FILO register 220 through the second transmission path 160 and a second mode in which data stored in the nonvolatile FILO register 220 is read out to the second transmission path 160.

The control circuit 110 outputs a mode control signal through the control signal line 111 to switch the first mode and the second mode of the nonvolatile FILO register 220.

In the semiconductor device 100 described in this embodiment, data written to the register 210 can be stored in the nonvolatile FILO register 220. Since the power consumption of the nonvolatile FILO register 220 in a standby state is low, the memory capacity of the nonvolatile FILO register 220 can be increased while the power consumption of the semiconductor device 100 is reduced. Note that data can be transferred between the register 210 and the nonvolatile FILO register 220 through the second transmission path 160 even when the first transmission path 150 transfers another data. As a result, the semiconductor device 100 including the register 210 whose power consumption is low and from which data can be stored at high speed can be provided.

The following describes individual components included in the semiconductor device of one embodiment of the present invention.

<<Register>>

The operation speed of the register 210 is preferably higher; for example, the operation speed of the register 210 is preferably higher than that of the nonvolatile FILO register 220. The higher the operation speed of the register 210 is, the higher the operation speed of the semiconductor device becomes.

In the case where the register 210 is formed using a transistor, a variety of semiconductors can be used for a channel formation region. For example, a semiconductor containing an element belonging to Group 14 of the periodic table (e.g., Si, Ge, or SiC), a compound semiconductor (e.g., GaAs or GaP), a semiconductor having a wider band gap than silicon (e.g., an oxide semiconductor), or the like can be used. In particular, a semiconductor having crystallinity is preferable because it has high mobility and enables the operation speed of the transistor to be high.

The register 210 may be a volatile memory circuit which consumes power in holding data.

Note that data in the register 210 can be stored in the nonvolatile FILO register 220. After data in the register 210 is stored in the nonvolatile FILO register 220, power supply to the register 210 is stopped so that power consumption can be reduced. After power supply to the register 210 is restarted, data stored in the nonvolatile FILO register 220 is restored to the register 210 through the second transmission path 160, the reading/writing circuit 120, and the first transmission path 150. By such a series of operations, the state of the register 210 can be returned in an extremely short time to a state which is the same as that just before power supply is stopped. As a result, power consumption can be reduced without a significant reduction in operation speed.

<<Reading/Writing Circuit>>

The reading/writing circuit 120 writes data read out from the second transmission path 160 to the first transmission path 150.

<<Nonvolatile FILO Register>>

The nonvolatile FILO register 220 stores data in the second transmission path 160 and the stored data is read out to the second transmission path 160.

An example of the structure of the nonvolatile FILO register 220 will be described in detail in Embodiment 2.

<<Control Circuit>>

The control circuit 110 outputs a mode control signal to the nonvolatile FILO register 220 through the control signal line 111 to control the operation of the nonvolatile FILO register 220. Specifically, an operation in which data is read out from the nonvolatile FILO register 220 and an operation in which data is written to the nonvolatile FILO register 220 are switched.

Modification Example 1

A modification example of the semiconductor device described in this embodiment of the present invention will be described with reference to FIG. 1B.

A semiconductor device 100B illustrated in FIG. 1B includes a first memory access determination circuit 214 which outputs a wait signal in a period during which data is written to the nonvolatile FILO register 220.

Since the semiconductor device 100B includes the first memory access determination circuit 214, a failure in which, before writing data read from the register 210 to the nonvolatile FILO register 220 is finished, another data is written to the register 210 can be prevented. As a result, a semiconductor device with less malfunction, high reliability, and low power consumption, which includes a register from which data can be stored at high speed, can be provided.

A memory access determination circuit that can be used in the modification example of this embodiment will be described below.

<<Memory Access Determination Circuit>>

The first memory access determination circuit 214 outputs a wait signal to a terminal 215 so that an access request for the register 210 is not made while data read from the register 210 is written to the nonvolatile FILO register 220. Another circuit monitors the terminal 215, whereby data can be prevented from being written to the register 210 at an inappropriate timing.

Modification Example 2

Another modification example of the semiconductor device described in this embodiment of the present invention will be described with reference to FIG. 1C.

A semiconductor device 100D illustrated in FIG. 1C includes a second memory access determination circuit 216 which outputs a wait signal in a period during which data is written to the nonvolatile FILO register 220.

Since the semiconductor device 100D includes the second memory access determination circuit 216, data which is read from the register 210 and then written to the nonvolatile FILO register 220 is monitored so that a flood of data can be prevented. As a result, a semiconductor device with less malfunction, high reliability, and low power consumption, which includes a register from which data can be stored at high speed, can be provided.

The second memory access determination circuit 216 that can be used in the modification example of this embodiment will be described below.

<<Second Memory Access Determination Circuit>>

The second memory access determination circuit 216 monitors data written to the nonvolatile FILO register 220 from the register 210, and outputs a wait signal to a terminal 217 just before the data is newly written when the volume of the data exceeds the capacity of the nonvolatile FILO register 220. Another circuit monitors a wait signal output to the terminal 217, whereby data can be prevented from being written to the nonvolatile FILO register 220 and can be written to another memory circuit (e.g., a stack register or an external memory device). As a result, data can be prevented from being written when the volume of the data exceeds the capacity of the nonvolatile FILO register 220, and data in the nonvolatile FILO register 220 can be prevented from being lost. Further, data writing at an inappropriate timing can be prevented.

This embodiment can be implemented in combination with any of the other embodiments in this specification as appropriate.

Embodiment 2

Figure 2:
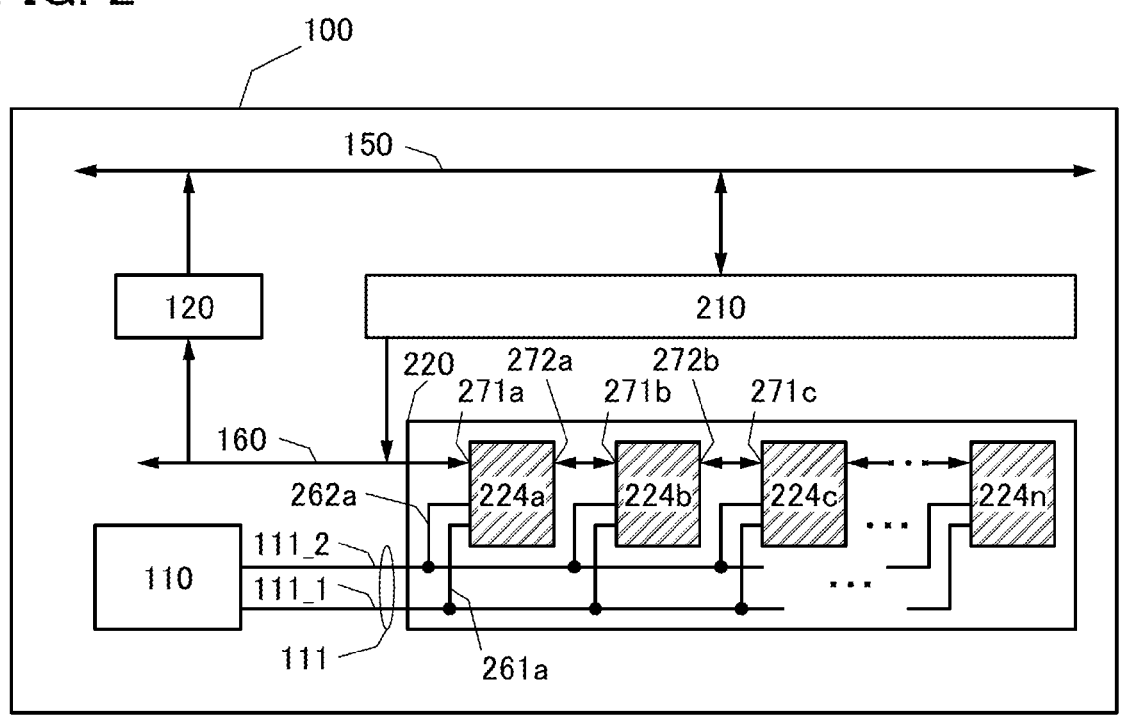
FIG. 2 is a block diagram illustrating the structure of a semiconductor device of an embodiment.
Figure 6A:
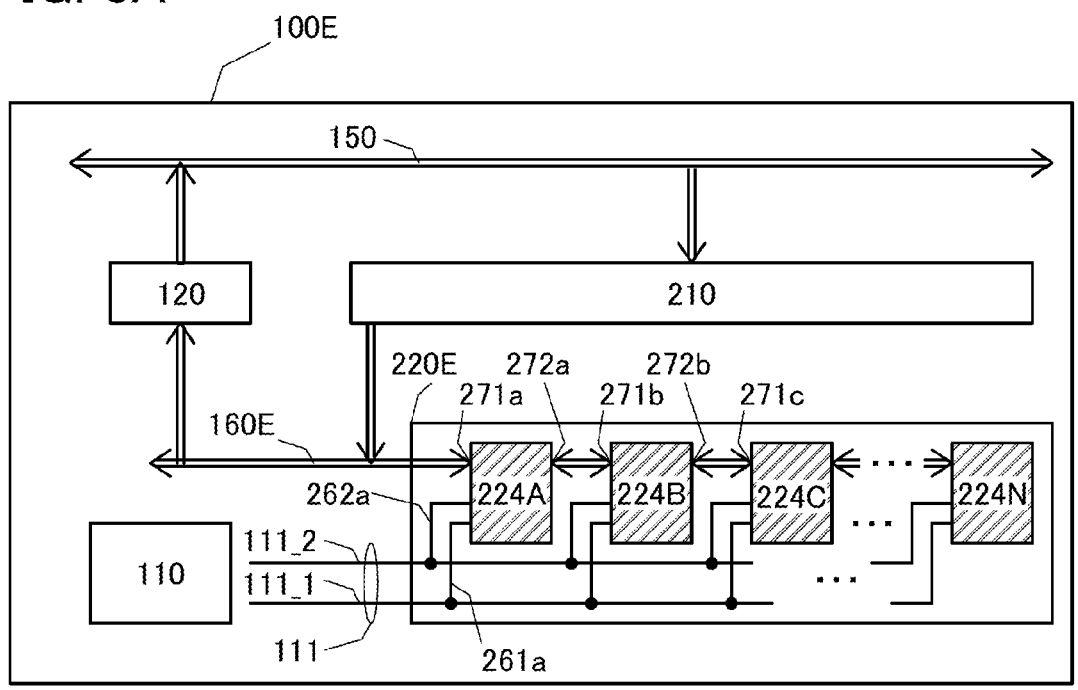
FIGS. 6A and 6B are block diagrams illustrating the structure of a semiconductor device of an embodiment.
Figure 6B:
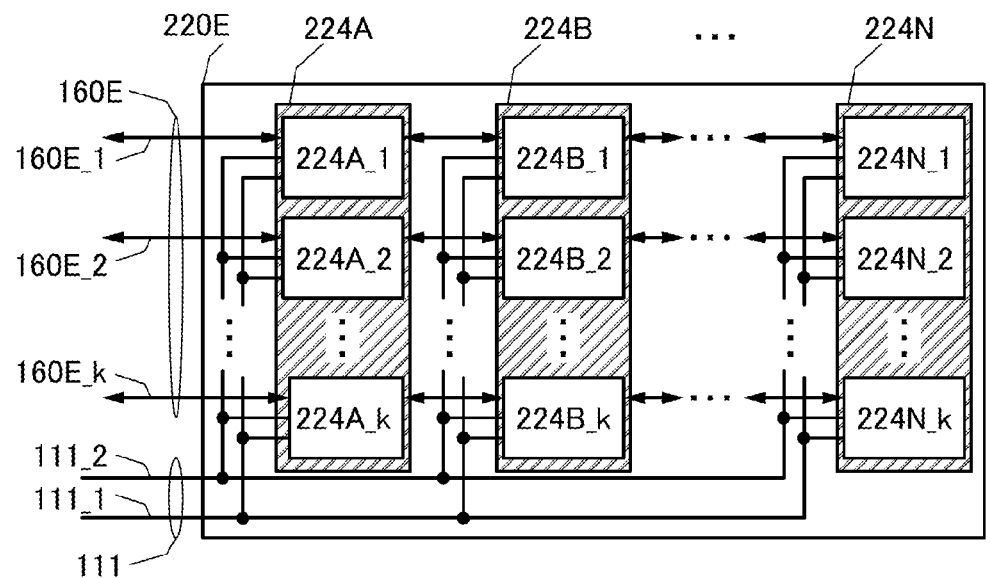

In this embodiment, the structure of a nonvolatile FILO register applicable to a semiconductor device of one embodiment of the present invention will be described with reference to FIG. 2 and FIGS. 6A and 6B. FIG. 2 is a block diagram illustrating the structure of a semiconductor device handling 1-bit data in one embodiment of the present invention, and FIGS. 6A and 6B are block diagrams illustrating the structure of a nonvolatile FILO register 220E applicable to a semiconductor device handling k-bit (k is a natural number of 2 or more) data in one embodiment of the present invention.

The nonvolatile FILO register 220 described in this embodiment is a shift register in which the shift direction is inverted depending on a mode control signal input through a first control signal line 111_1. The nonvolatile FILO register 220 is formed of a nonvolatile flip-flop circuit, and can hold data even without power supply. Thus, the memory capacity of the register can be increased while an increase in power consumption is suppressed.

<Structure of Nonvolatile FILO Register>

The nonvolatile FILO register 220 includes n (n is a natural number of 2 or more) nonvolatile flip-flop circuits. In FIG. 2, a first nonvolatile flip-flop circuit 224a, a second nonvolatile flip-flop circuit 224b, a third nonvolatile flip-flop circuit 224c, and an n-th nonvolatile flip-flop circuit 224n are illustrated.

Each of the nonvolatile flip-flop circuits includes a first terminal, a second terminal, a first control terminal, and a second control terminal.

For example, the first nonvolatile flip-flop circuit 224a includes a first terminal 271a, a second terminal 272a, a first control terminal 261a, and a second control terminal 262a. The second nonvolatile flip-flop circuit 224b includes a first terminal 271b and a second terminal 272b.

These nonvolatile flip-flop circuits hold stored data even without power supply. One of the first terminal and the second terminal functions as an input terminal and the other thereof functions as an output terminal in response to a mode control signal input to the first control terminal in the state where power is supplied, and the nonvolatile flip-flop circuit outputs stored first data to the output terminal and stores second data input from the input terminal in response to a clock signal input to the second control terminal.

For example, in the first flip-flop circuit, the first terminal 271a functions as an input terminal and the second terminal 272a functions as an output terminal in response to a first mode control signal input to the first control terminal 261a. Further, in response to a clock signal input to the second control terminal 262a, stored first data is output to the second terminal 272a, and second data is input from the first terminal 271a to be stored. The second terminal 272a functions as an input terminal and the first terminal 271a functions as an output terminal in response to a second mode control signal input to the first control terminal 261a. Further, in response to a clock signal input to the second control terminal 262a, stored third data is output to the first terminal 271a, and fourth data is input from the second terminal 272a to be stored.

The first control terminal of each of the nonvolatile flip-flop circuits is electrically connected to the first control signal line 111_1, and the second control terminal thereof is electrically connected to a second control signal line 111_2.

The first terminal 271a of the first nonvolatile flip-flop circuit 224a is electrically connected to the second transmission path 160, and the second terminal 272a thereof is electrically connected to the first terminal 271b of the second nonvolatile flip-flop circuit 224b. The second terminal 272b of the second nonvolatile flip-flop circuit 224b is electrically connected to a first terminal 271c of the third nonvolatile flip-flop circuit 224c.

<Operation of Nonvolatile FILO Register>

The operation of the nonvolatile FILO register 220 in this embodiment will be described.

When the first mode control signal is input to the nonvolatile FILO register 220 through the first control signal line 111_1, the first terminal of the nonvolatile flip-flop circuit functions as an input terminal and the second terminal thereof functions as an output terminal.

In other words, the second terminal functioning as an output terminal of the m-th (m is a natural number greater than or equal to 1 and less than or equal to (n−1)) nonvolatile flip-flop circuit is connected to the first terminal functioning as an input terminal of the (m+1)-th nonvolatile flip-flop circuit. The plurality of nonvolatile flip-flop circuits connected in series with respect to the second transmission path 160 functions as a shift register in which data is shifted from the m-th nonvolatile flip-flop circuit to the (m+1)-th nonvolatile flip-flop circuit in response to a clock signal input to the second control signal line 111_2.

When the second mode control signal is input to the nonvolatile FILO register 220 through the first control signal line 111_2, the first terminal of the nonvolatile flip-flop circuit functions as an output terminal and the second terminal thereof functions as an input terminal.

In other words, the first terminal functioning as an output terminal of the (m+1)-th nonvolatile flip-flop circuit is connected to the second terminal functioning as an input terminal of the m-th nonvolatile flip-flop circuit. The plurality of nonvolatile flip-flop circuits connected in series with respect to the second transmission path 160 functions as a shift register in which data is shifted from the (m+1)-th nonvolatile flip-flop circuit to the m-th nonvolatile flip-flop circuit in response to a clock signal input to the second control signal line 111_2.

The semiconductor device described in this embodiment includes a plurality of nonvolatile flip-flop circuits in which the first control terminals are connected in parallel with the first control signal line 111_1 and the second control terminals are connected in parallel with the second control signal line 111_2. In each of the nonvolatile flip-flop circuits, the input terminal and the output terminal are interchanged with each other in response to the mode control signal input from the control circuit 110 through the first control signal line 111_1. The nonvolatile flip-flop circuits are connected in series with respect to the second transmission path 160. The nonvolatile FILO register is formed in this manner.

Accordingly, by a reduction in the number of kinds of control signals, the structure of the control circuit 110 can be simplified, and an increase in the number of the control signal lines 111 and an increase in the area occupied by the control circuit 110 or wirings including the control signal lines 111 can be prevented. As a result, the manufacturing process can be simplified, the capacity of the nonvolatile FILO register 220 can be increased, or a signal delay due to an increase in the wiring capacitance can be prevented.

With the use of the nonvolatile FILO register 220 including the plurality of nonvolatile flip-flop circuits and the register 210, the semiconductor device 100 including the register 210 whose power consumption is reduced and from which data can be stored at high speed can be provided.

Individual components of the nonvolatile FILO register applicable to the semiconductor device of one embodiment of the present invention will be described below.

<<Nonvolatile Flip-Flop Circuit>>

The nonvolatile flip-flop circuits can be formed using a variety of rewritable nonvolatile memory circuits.

A rewritable nonvolatile memory circuit can be formed using, for example, a transistor whose leakage current in an off state is extremely small described in Embodiment 4 as well as a rewritable nonvolatile memory element such as a magnetoresistive random access memory, a ferroelectric memory, a flash memory, a phase change memory, or a resistive random access memory.

<<Control Circuit>>

The control circuit 110 outputs a mode control signal to switch the writing operation and the reading operation of the nonvolatile FILO register. Since the plurality of nonvolatile flip-flop circuits is connected to the first control signal line 111_1 in parallel with the control circuit 110, the operation of the nonvolatile FILO register can be controlled with a smaller number of control signals and a smaller number of control signal lines.

Accordingly, the structure of the control circuit 110 can be simplified, and an increase in the number of the control signal lines 111 and an increase in the area occupied by the control circuit 110 or wirings including the control signal lines 111 can be prevented. As a result, the manufacturing process can be simplified, the capacity of the nonvolatile FILO register 220 can be increased, or a signal delay due to an increase in the wiring capacitance can be prevented.

A method in which data written to a register is stored in a stack memory has been conventionally known. In this method, in the case where an address space in part of an external memory circuit such as a cache memory is used for a stack memory, a decoder specifying an address is needed in addition to a writing circuit and a reading circuit. An address line, an enable signal line, and the like are further needed in addition to a clock signal line providing an instruction for reading or writing.

For example, a 1 MB ($2^{23}$-bit) stack memory needs as many as 23 address lines.

On the other hand, in the semiconductor device 100 in this embodiment, the nonvolatile FILO register 220 is provided together with the register 210; thus, only the first control signal line 111_1 transmitting a mode control signal and the second control signal line 111_2 transmitting a clock signal for an instruction for reading or writing are needed. There is no particular limitation on the control circuit 110 as long as it supplies a mode control signal and a clock signal to the nonvolatile FILO register 220 in accordance with a reading/writing signal; thus, the structure of the control circuit 110 can be made simple in comparison with a conventional control circuit controlling a stack memory.

Modification Example

A semiconductor device 100E described in this embodiment of the present invention will be described with reference to FIGS. 6A and 6B. Specifically, the semiconductor device 100E in FIG. 6A can handle k-bit (k is a natural number of 2 or more) data, which is different from the semiconductor device 100 in FIG. 2 handling 1-bit data. Note that the semiconductor device 100E can handle, in addition to data, part of data, large-scale information such as a program, and part of a program.

The semiconductor device 100E illustrated in FIG. 6A is a modification example of the semiconductor device 100 illustrated in FIG. 2, and their structures have a lot in common. Therefore, the description of the semiconductor device 100 is referred to for common portions, and different portions are mainly described below.

A transmission path 160E in the semiconductor device 100E includes k transmission lines; thus, k-bit data can be transmitted, which is different from the 1-bit semiconductor device 100. Further, the nonvolatile FILO register 220E in the semiconductor device 100E can store k-bit data.

An example of the structure of the nonvolatile FILO register 220E is illustrated in FIG. 6B.

<<Structure of Nonvolatile FILO Register Capable of Storing k-bit Data>>

The nonvolatile FILO register 220E includes N (N is a natural number of 2 or more) nonvolatile memory circuits. In FIG. 6B, a first nonvolatile memory circuit 224A, a second nonvolatile memory circuit 224B, and an N-th nonvolatile memory circuit 224N are illustrated.

Each of the nonvolatile memory circuits includes k nonvolatile flip-flop circuits. For example, k nonvolatile flip-flop circuits (224A_1 to 224A_k) are provided in the first nonvolatile memory circuit 224A, k nonvolatile flip-flop circuits (224B_1 to 224B_k) are provided in the second nonvolatile memory circuit 224B, and k nonvolatile flip-flop circuits (224N_1 to 224N_k) are provided in the N-th nonvolatile memory circuit 224N.

A first terminal of the j-th (j is a natural number greater than or equal to 1 and less than or equal to k) nonvolatile flip-flop circuit in the first nonvolatile memory circuit 224A is electrically connected to the j-th transmission line 160E_j in the transmission path 160E. A second terminal of the j-th nonvolatile flip-flop circuit in the M-th (M is a natural number greater than or equal to 1 and less than or equal to (N−1)) nonvolatile memory circuit is electrically connected to a first terminal of the j-th nonvolatile flip-flop circuit in the (M+1)-th nonvolatile memory circuit. In other words, N nonvolatile flip-flop circuits connected in series with respect to the j-th transmission line 160E_j form a shift register.

The k transmission lines in the transmission path 160E are each provided with a shift register, and the nonvolatile FILO register 220E includes k shift registers.

Accordingly, the semiconductor device 100E can handle k-bit data. By a reduction in the number of kinds of control signals, the structure of the control circuit 110 can be simplified, and an increase in the number of the control signal lines 111 and an increase in the area occupied by the control circuit 110 or wirings including the control signal lines 111 can be prevented. As a result, the manufacturing process can be simplified, the capacity of the k-bit nonvolatile FILO register 220E can be increased, or a signal delay due to an increase in the wiring capacitance can be prevented.

This embodiment can be implemented in combination with any of the other embodiments in this specification as appropriate.

Embodiment 3

Figure 3A:
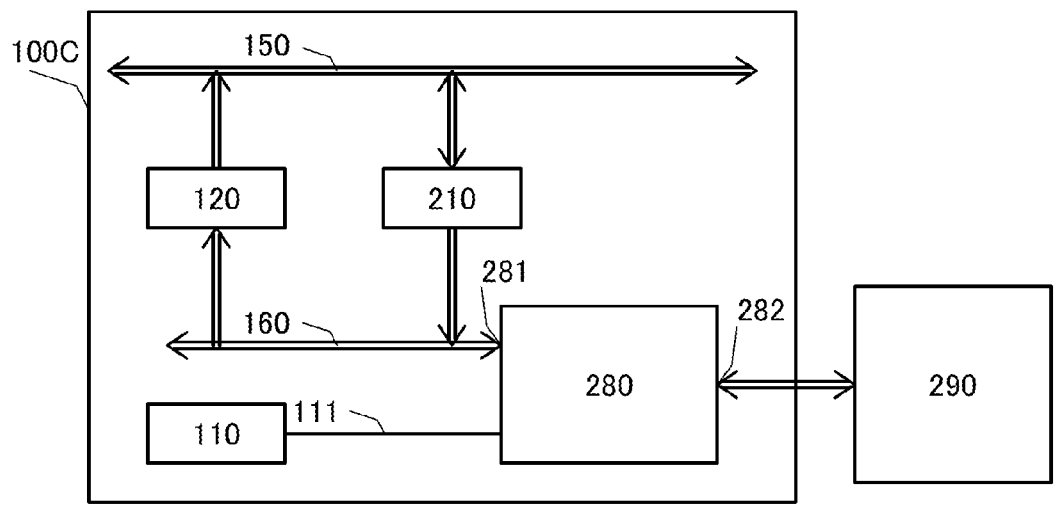
FIGS. 3A and 3B are block diagrams illustrating the structure of a semiconductor device of an embodiment.
Figure 3B:
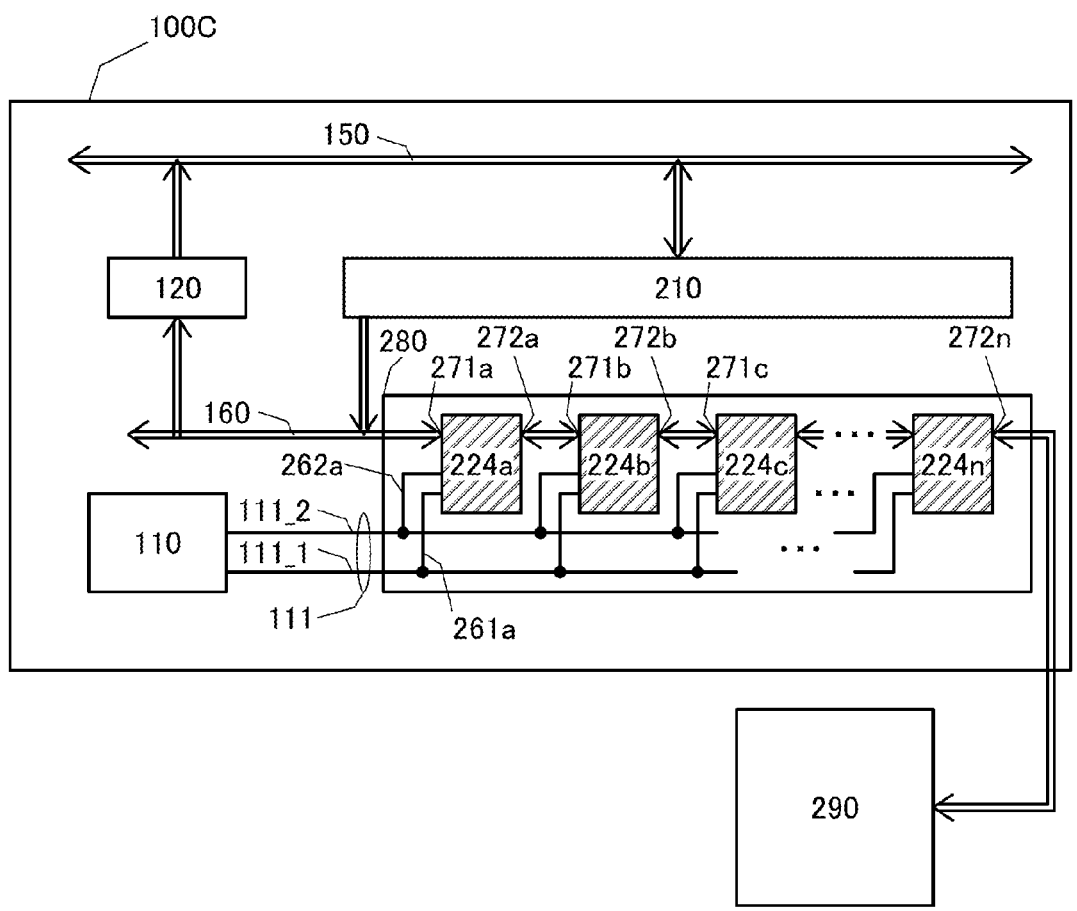

In this embodiment, the structure of a semiconductor device of one embodiment of the present invention will be described with reference to FIGS. 3A and 3B. FIG. 3A is a block diagram illustrating the structure of the semiconductor device of one embodiment of the present invention, and FIG. 3B is a block diagram illustrating the structure of an FIFO register that can be used in the semiconductor device.

In a semiconductor device 100C illustrated in FIG. 3A, a nonvolatile FILO register includes a nonvolatile external memory device 290 and a nonvolatile FIFO register 280 including a first input/output terminal 281 electrically connected to the second transmission path 160 and a second input/output terminal 282 connected to the external memory device 290.

The nonvolatile FIFO register 280 operates in a first mode and a second mode.

To the nonvolatile FIFO register 280, data can be written from the first input/output terminal 281 in the first mode. Further, the oldest data input from the first input/output terminal 281 can be transmitted to the second input/output terminal 282. Data read from the second input/output terminal 282 of the nonvolatile FIFO register 280 is written to the external memory device 290.

In the nonvolatile FIFO register 280, in the second mode, the latest data input from the first input/output terminal 281 is read out to the first input/output terminal 281 and data is written from the second input/output terminal 282. Data read by the external memory device 290 is input to the second input/output terminal 282 of the nonvolatile FIFO register 280.

Since the nonvolatile FILO register in the semiconductor device 100C includes the nonvolatile external memory device 290 and the nonvolatile FIFO register 280 electrically connected to the external memory device 290, the capacity of the nonvolatile FILO register can be made significantly large. As a result, there is no possibility of an overflow of the FILO register; thus, a semiconductor device with high reliability and low power consumption, which includes the register from which data can be stored at high speed, can be provided.

The following describes individual components included in the semiconductor device of one embodiment of the present invention.

<<Nonvolatile FIFO Register>>

The nonvolatile FIFO register 280 described in this embodiment is a shift register in which the shift direction is inverted depending on a mode control signal input through the first control signal line 111_1. The nonvolatile FIFO register 280 is formed of a nonvolatile flip-flop circuit, and can hold data even without power supply. Thus, the memory capacity of the register can be increased while an increase in power consumption is suppressed.

The nonvolatile FIFO register 280 is a modification example of the nonvolatile FILO register 220 described in Embodiment 2, and their structures have a lot in common. Therefore, the description in Embodiment 2 is referred to for common portions, and different portions are mainly described in this embodiment.

Specifically, the nonvolatile FIFO register 280 includes n (n is a natural number of 2 or more) nonvolatile flip-flop circuits similarly to the nonvolatile FILO register 220 described in Embodiment 2. The nonvolatile FIFO register 280 has the same structure as the nonvolatile FILO register 220 except that a second terminal 272n of the n-th nonvolatile flip-flop circuit is electrically connected to the nonvolatile external memory device 290.

<<Operation of Nonvolatile FIFO Register>>

The operation of the nonvolatile FIFO register 280 in this embodiment is described in comparison with the operation of the nonvolatile FILO register 220.

When a first mode control signal is input to the nonvolatile FIFO register 280 through the first control signal line 111_1, the first terminal of the nonvolatile flip-flop circuit functions as an input terminal and the second terminal thereof functions as an output terminal.

The nonvolatile FIFO register 280 operates in the same manner as the nonvolatile FILO register 220 until the first nonvolatile flip-flop circuit 224a sequentially stores n pieces of data from the second transmission path 160.

The nonvolatile FILO register 220 can store n pieces of data at most. When the first nonvolatile flip-flop circuit 224a stores (n+1)-th data, data second from the oldest (second data) is written to the n-th flip-flop circuit 224n, and the oldest data (first data) is lost.

On the other hand, the nonvolatile FIFO register 280 also can store n pieces of data at most. When the first nonvolatile flip-flop circuit 224a stores the (n+1)-th data, the n-th flip-flop circuit 224n outputs the oldest data (first data) to the second terminal 272n, and the data second from the oldest (second data) is written to the n-th flip-flop circuit 224n.

Note that the oldest data (first data) read by the second terminal 272n is written to the external memory device 290.

When the second mode control signal is input to the nonvolatile FILO register 220 or the nonvolatile FIFO register 280 through the first control signal line 111_1, the first terminal of the nonvolatile flip-flop circuit functions as an output terminal and the second terminal thereof functions as an input terminal.

In the nonvolatile FILO register 220, when one piece of data is read from the first nonvolatile flip-flop circuit 224a, null data is written to the n-th flip-flop circuit 224n.

On the other hand, in the nonvolatile FIFO register 280, when one piece of data is read from the first nonvolatile flip-flop circuit 224a, the latest data written to the external memory device 290 is written to the n-th flip-flop circuit 224n.

Figure 9A:
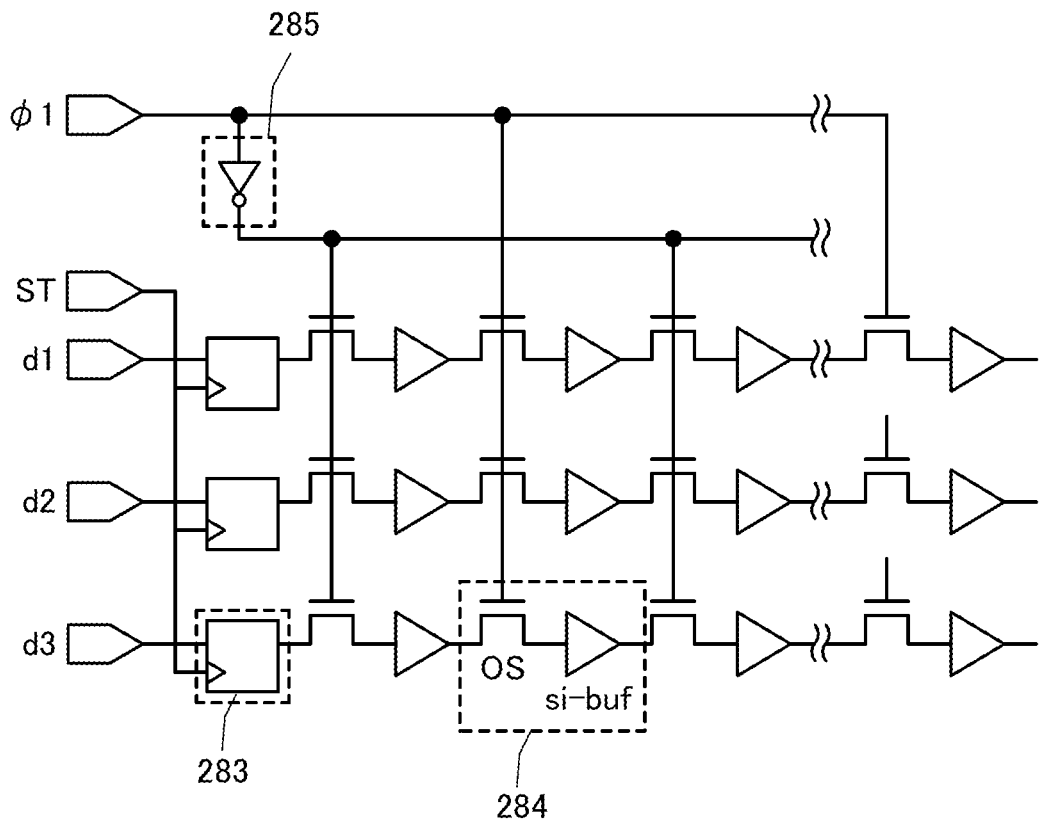
FIGS. 9A and 9B each illustrate the structure of a nonvolatile FIFO circuit of an embodiment.

Note that as the nonvolatile FIFO register 280, for example, such a high-density nonvolatile FIFO circuit in which a plurality of latch circuits 284 is connected in series as is illustrated in FIG. 9A can also be used.

The nonvolatile FIFO circuit in FIG. 9A shows an example in which the number of pieces of input data is three, and each of d1, d2, and d3 corresponds to the second transmission path 160 in FIGS. 3A and 3B. The control circuit 110 can output a plurality of mode control signals, and ST can be connected to the first control signal line 111_1 from which a second mode control signal is output.

In the case where a third control signal line that is different from the first control signal line 111_1 and can output a mode control signal is provided as one of signal lines connected to the control circuit 110, ST may be connected to the third control signal line. To the second control signal line 111_2, $\phi 1$ is connected.

Figure 9B:
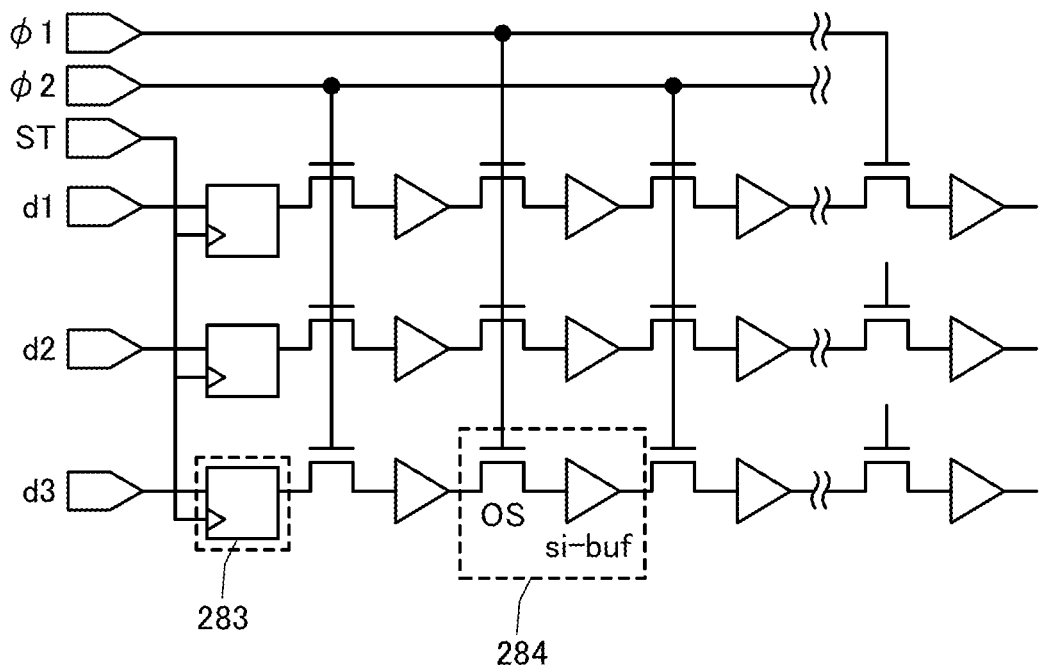

Note that in the case where a fourth control signal line that is different from the second control signal line 111_2 and outputs a clock signal is provided as one of the signal lines connected to the control circuit 110, $\phi 1$ may be connected to the second control signal line 111_2 and φ2 may be connected to the fourth control signal line as illustrated in FIG. 9B.

Note that there is no particular limitation on the structure of a circuit 283 as long as it is a D-FF circuit and is a D-type flip-flop circuit.

The nonvolatile FIFO circuit includes a transistor whose leakage current in an off state is extremely small described in Embodiment 4. Therefore, by stacking such a transistor and a transistor which includes silicon or the like (a transistor forming a buffer, an inverter 285, or the like) and is a component element of the nonvolatile FIFO circuit, the area occupied by the nonvolatile FIFO circuit can be reduced.

Further, a structure in which the nonvolatile FIFO circuit is added to the semiconductor device of one embodiment of the present invention may also be employed. For example, by using the nonvolatile FIFO circuit for a nonvolatile memory device, the operation condition (the state) of the semiconductor device before and after power gating can be saved. Further, the operation history or the like of the semiconductor device, which is needed for analysis of the cause of breakdown of the semiconductor device, can be sequentially saved.

<<Nonvolatile External Memory Device>>

There is no particular limitation on the external memory device 290 as long as it is rewritable and nonvolatile. A rewritable nonvolatile memory circuit can be formed using, for example, a DRAM including a transistor whose leakage current in an off state is extremely small described in Embodiment 4, a NAND memory circuit, or a NOR memory circuit as well as a rewritable nonvolatile memory element such as a magnetoresistive random access memory, a ferroelectric memory, a flash memory, a phase change memory, or a resistive random access memory.

This embodiment can be implemented in combination with any of the other embodiments in this specification as appropriate.

Embodiment 4

Figure 4A:
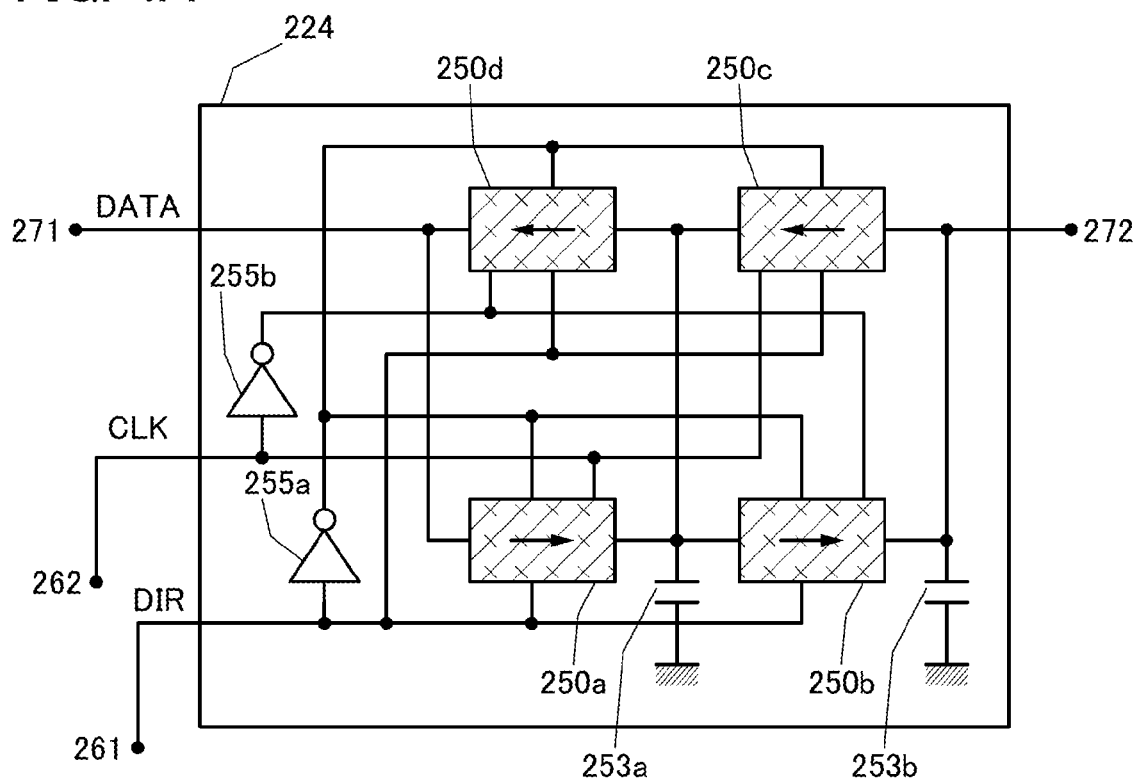
FIGS. 4A to 4C are block diagrams illustrating the structure of a nonvolatile flip-flop applicable to a semiconductor device of an embodiment.
Figure 4B:
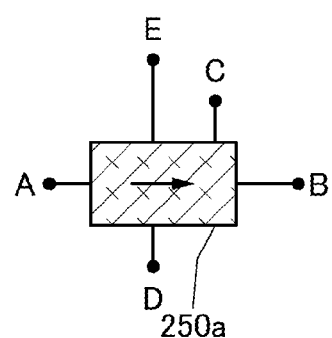
Figure 4C:
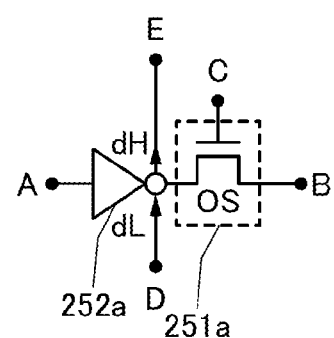

In this embodiment, the structure of a nonvolatile flip-flop circuit applicable to an FILO register in a semiconductor device of one embodiment of the present invention will be described with reference to FIGS. 4A to 4C. FIG. 4A is a circuit diagram illustrating the structure of the nonvolatile flip-flop circuit applicable to a semiconductor device of one embodiment of the present invention, FIG. 4B illustrates the arrangement of terminals in a component circuit in FIG. 4A, and FIG. 4C illustrates an example of the component circuit.

The nonvolatile flip-flop circuit in this embodiment includes four component circuits (component circuits 250a to 250d) (see FIG. 4A).

Each of the component circuits includes an A terminal, a B terminal, a C terminal, a D terminal, and an E terminal. The A terminal and the B terminal are in a high impedance state when a low potential is input to the D terminal and a high potential is input to the E terminal. A signal is output to the B terminal in accordance with a signal input from the A terminal when the high potential is input to the C terminal and the D terminal and the low potential is input to the E terminal (see FIG. 4B).

One terminal of a first capacitor 253a is connected to a B terminal of the first component circuit 250a, an A terminal of the second component circuit 250b, a B terminal of the third component circuit 250c, and an A terminal of the fourth component circuit 250d, and the other terminal thereof is grounded.

One terminal of a second capacitor 253b is connected to a B terminal of the second component circuit 250b and an A terminal of the third component circuit 250c, and the other terminal thereof is grounded.

A first control terminal 261 is connected to a D terminal of the first component circuit 250a, a D terminal of the second component circuit 250b, an E terminal of the third component circuit 250c, and an E terminal of the fourth component circuit 250d.

A second control terminal 262 is connected to a C terminal of the first component circuit 250a and a C terminal of the third component circuit 250c.

An input terminal of a first inverter circuit 255a is connected to the first control terminal 261, and an input terminal of a second inverter circuit 255b is connected to the second control terminal 262.

A first terminal 271 is connected to an A terminal of the first component circuit 250a and a B terminal of the fourth component circuit 250d, and a second terminal 272 is connected to the B terminal of the second component circuit 250b and the A terminal of the third component circuit 250c.

An output terminal of the first inverter circuit 255a is connected to an E terminal of the first component circuit 250a, an E terminal of the second component circuit 250b, a D terminal of the third component circuit 250c, and a D terminal of the fourth component circuit 250d. An output terminal of the second inverter circuit 255b is connected to a C terminal of the second component circuit 250b and a C terminal of the fourth component circuit 250d.

The nonvolatile flip-flop circuit 224 that can be used in the nonvolatile FILO register in the semiconductor device of one embodiment of the present invention includes a storage node connected to the first capacitor 253a. The nonvolatile flip-flop circuit 224 stores data input to the input terminal and outputs data stored in the nonvolatile flip-flop circuit 224 in response to a clock signal input to the second control terminal 262. The input terminal and the output terminal are interchanged in response to a mode control signal input to the first control terminal 261. The inverter circuit connected to each control terminal generates an inverted signal inside the inverter circuit.

Accordingly, by providing the plurality of flip-flop circuits, the capacity of the nonvolatile FILO register can be increased while the number of the control signal lines does not need to be three or more. As a result, a semiconductor device in which an increase in the area occupied by a control circuit or a wiring can be suppressed, in which a delay in signal due to an increase in wiring capacitance can be suppressed, and which can be manufactured easily can be provided, or a semiconductor device including a register from which data can be stored at high speed and whose power consumption is reduced can be provided.

The following describes individual components included in the semiconductor device of one embodiment of the present invention.

<<Component Circuit>>

The component circuit is also referred to as a latch circuit. In the component circuit, the A terminal and the B terminal are in a high impedance state when the low-potential is input to the D terminal and the high-potential is input to the E terminal, and a signal is output to the B terminal in accordance with a signal input from the A terminal when the high-potential is input to each of the C terminal and the D terminal and the low-potential is input to the E terminal (see FIG. 4B).

The first component circuit 250a will be described as an example of the configuration of a component circuit that can be used in this embodiment with reference to FIG. 4C.

The first component circuit 250a includes a first three-state buffer 252a and a first switching transistor 251a whose first electrode is connected to an output terminal of the first three-state buffer 252a.

The A terminal of the first component circuit 250a is connected to an input terminal of the first three-state buffer 252a, the B terminal thereof is connected to a second electrode of the first switching transistor 251a, and the C terminal thereof is connected to a gate electrode of the first switching transistor 251a. Further, the D terminal of the first component circuit 250a is connected to a mode control signal terminal of the first three-state buffer 252a, and the E terminal thereof is connected to an inverted mode control signal terminal of the first three-state buffer 252a.

<<Switching Transistor>>

The first switching transistor 251a is a transistor whose leakage current in an off state is extremely small. The transistor that can be used as the first switching transistor 251a includes, for example, a semiconductor having wider band gap and lower intrinsic carrier density than silicon.

A semiconductor having wider band gap and lower intrinsic carrier density than silicon, which can be used for a region where a channel is formed in the first switching transistor 251a, will be described in detail in Embodiment 5.

<<Three-State Buffer>>

The first three-state buffer 252a outputs a signal to the output terminal in accordance with a signal input to the input terminal through the A terminal of the component circuit when the high-level potential is input through the D terminal of the component circuit and the low-level potential is input through the E terminal of the component circuit. Specifically, a logical value input to the input terminal through the A terminal is inverted, and the inverted logical value is output to the output terminal.

The input terminal and the output terminal of the first three-state buffer 252a are in a high impedance state when the low-level potential is input through the D terminal of the first component circuit 250a and the high-level potential is input through the E terminal of the first component circuit 250a.

In the first three-state buffer 252a, current does not leak through the high impedance input terminal. For example, a gate electrode of a transistor is used as the input terminal.

The second electrode of the first switching transistor 251a is electrically connected to the first capacitor 253a through the B terminal of the first component circuit 250a, at which the storage node is formed.

In addition to the B terminal of the first component circuit 250a, the B terminal of the third component circuit 250c, the A terminal of the second component circuit 250b, and the A terminal of the fourth component circuit 250d are connected to the storage node.

As a result, the storage node is connected to the second electrode of the switching transistor whose leakage current in an off state is extremely small and to the high impedance input terminal of the three-state buffer; thus, data can be held for a long time even after power supply is stopped.

With the use of a switching transistor whose leakage current in an off state is extremely small, power consumed at the time of data writing can be reduced and thus an increase in power consumption can be suppressed in comparison with a ferroelectric memory or a flash memory.

Figure 5:
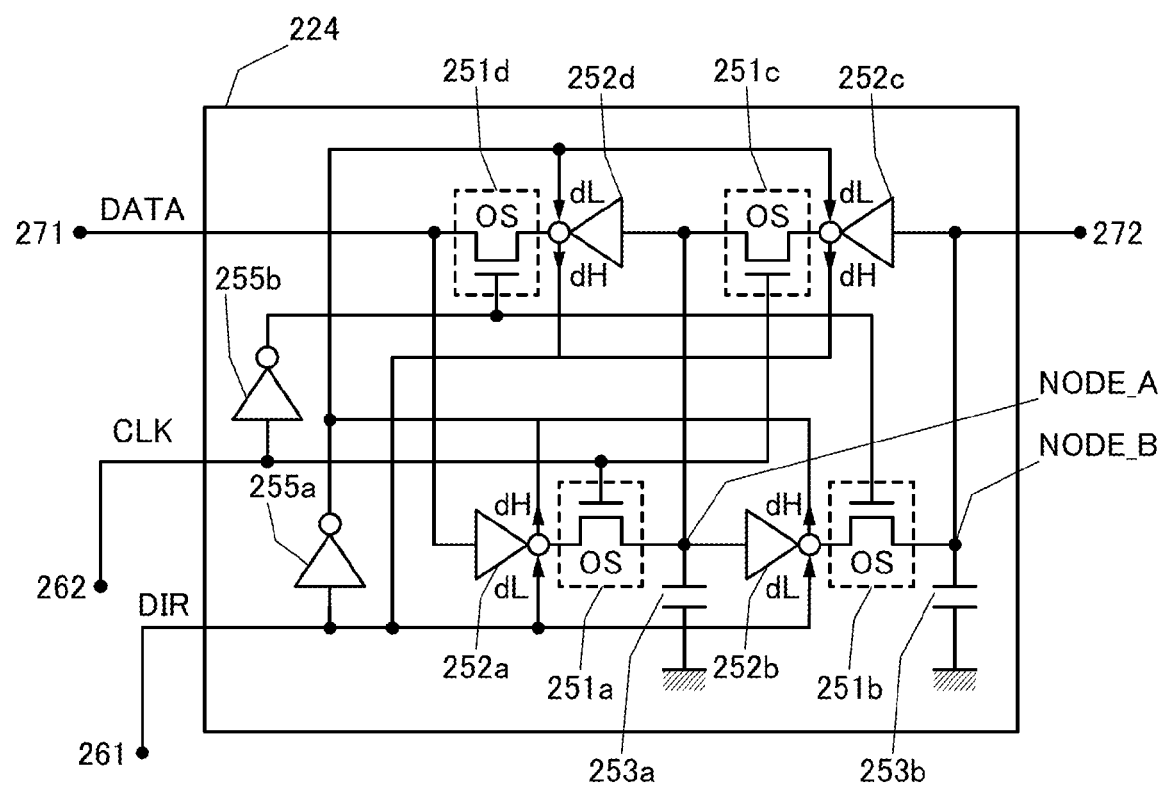
FIG. 5 is a circuit diagram illustrating the structure of a nonvolatile flip-flop applicable to a semiconductor device of an embodiment.

FIG. 5 is a circuit diagram of the nonvolatile flip-flop circuit 224 to which the component circuits illustrated in FIG. 4C are applied to the structure illustrated in FIG. 4A.

The flip-flop circuit 224 includes the first three-state buffer 252a, the first switching transistor 251a, a second three-state buffer 252b, a second switching transistor 251b, a third three-state buffer 252c, a third switching transistor 251c, a fourth three-state buffer 252d, and a fourth switching transistor 251d.

Note that a node where the second electrode of the first switching transistor 251a, the one terminal of the first capacitor 253a, an input terminal of the second three-state buffer 252b, a second terminal of the third switching transistor 251c, and an input terminal of the fourth three-state buffer 252d are connected to one another is referred to as NODE_A.

Further, a node where a second electrode of the second switching transistor 251b, the one terminal of the second capacitor 253b, and an input terminal of the third three-state buffer 252c are connected to one another is referred to as NODE_B. Note that NODE_B is connected to the second terminal 272 of the flip-flop circuit 224.

Figure 7:
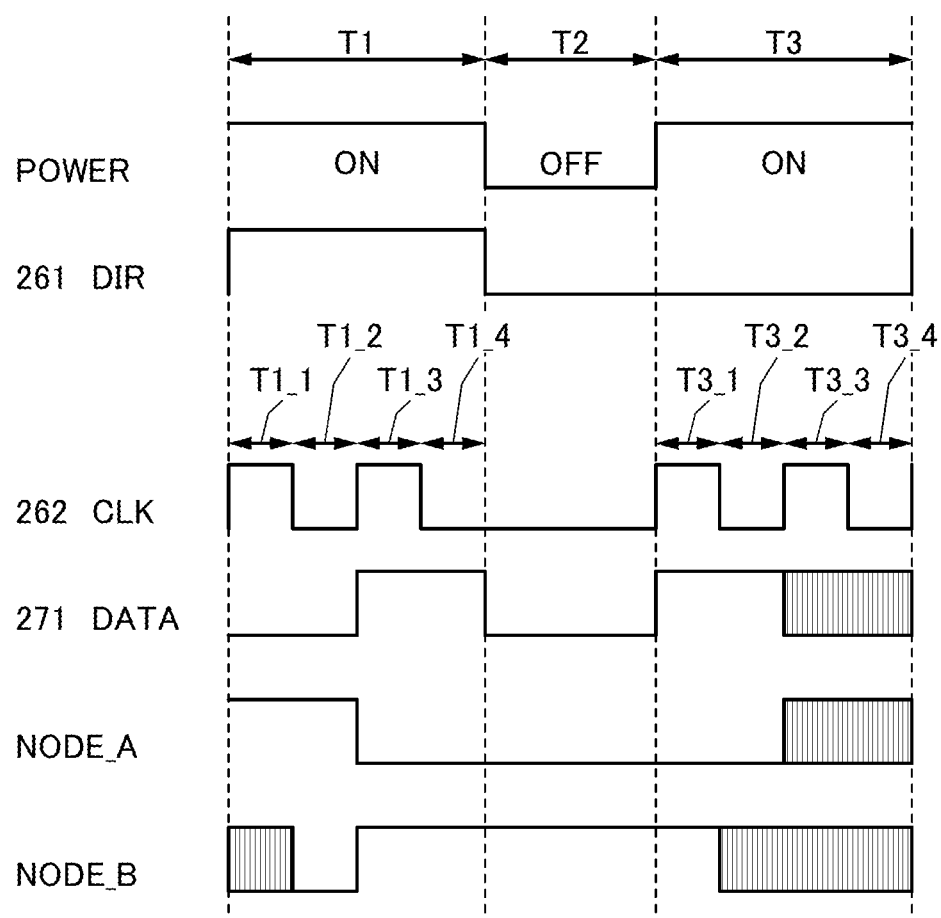
FIG. 7 is a timing chart showing the operations of a nonvolatile flip-flop applicable to a semiconductor device of an embodiment.

An example of the operation of the nonvolatile flip-flop circuit 224 will be described with reference to a timing chart shown in FIG. 7.

<Operation Method of Nonvolatile Flip-Flop Circuit>

In a first operation period T1, a first mode control signal (a high potential) is input to the first control terminal 261. The first three-state buffer 252a and the second three-state buffer 252b are on, and the third three-state buffer 252c and the fourth three-state buffer 252d are off. As a result, the first terminal 271 of the nonvolatile flip-flop circuit 224 functions as an input terminal, and the second terminal 272 thereof functions as an output terminal.

In a period T1_1 in the first operation period T1, a low potential is input to the first terminal 271 of the nonvolatile flip-flop circuit 224. The first three-state buffer 252a in an on state inverts the low potential input to the input terminal, and outputs the high potential to the first terminal of the first switching transistor 251a connected to the output terminal.

In the period T1_1, a clock signal having the high potential is input to the gate electrode of the first switching transistor 251a from the second control terminal 262. The first switching transistor 251a is on, and the potential of NODE_A depends on a potential input to the first terminal of the first switching transistor 251a (here, high potential).

Next, in a period T1_2 in the first operation period T1, a clock signal having the low potential is input to the gate electrode of the first switching transistor 251a from the second control terminal 262. The first switching transistor 251a is off, and the high potential is stored in NODE_A.

The second three-state buffer 252b in an on state inverts the potential of NODE_A (high potential), and outputs the low potential to the first terminal of the second switching transistor 251a connected to the output terminal.

The second inverter circuit 255b inverts a clock signal input to the second control terminal 262.

In the period T1_2, a clock signal which is the inverted signal of the clock signal having the low potential (that is, a clock signal having the high potential) is input to a gate electrode of the second switching transistor 251b. The second switching transistor 251b is on, and the potential of NODE_B depends on a potential input to the first terminal of the second switching transistor 251b (here, low potential).

As a result, the nonvolatile flip-flop circuit 224 outputs the low potential to the second terminal 272 connected to NODE_B.

From the above, it is clear that the low potential input to the first terminal 271 of the nonvolatile flip-flop circuit 224 is stored in the second terminal 272 in a period from the period T1_1 through the period T1_2 of the first operation period T1.

Then, in a period T1_3 and a period T1_4 in the first operation period T1, the high potential is input to the first terminal 271 of the nonvolatile flip-flop circuit 224. The nonvolatile flip-flop circuit 224 operates in accordance with the timing chart show in FIG. 7. As a result, the high potential input to the first terminal 271 of the nonvolatile flip-flop circuit 224 is stored in the second terminal 272 in a period from the period T1_3 through the period T1_4 of the first operation period T1.

In a second operation period T2, power supply is stopped. In other words, power gating is performed in the nonvolatile flip-flop circuit 224.

NODE_A and NODE_B are each connected to the second electrode of the switching transistor whose leakage current in an off state is extremely small and the high impedance input terminal. As a result, the potentials stored in NODE_A and NODE_B are held for a long time without being lost in comparison with the case of a structure using a transistor in which silicon is used for a semiconductor layer as a switching transistor.

In a third period T3, power supply is restarted. A second mode control signal (low potential) is input to the first control terminal 261. The first three-state buffer 252a and the second three-state buffer 252b are off, and the third three-state buffer 252c and the fourth three-state buffer 252d are on. As a result, the first terminal 271 of the nonvolatile flip-flop circuit 224 functions as an output terminal, and the second terminal 272 thereof functions as an input terminal.

In a period T3_1 in the third operation period T3, the low potential or the high potential is input to the second terminal 272 of the nonvolatile flip-flop circuit 224. The third three-state buffer 252c in an on state inverts the potential input to the input terminal, and outputs the inverted potential to the first terminal of the third switching transistor 251c connected to an output terminal.

In the period T3_1, a clock signal having the high potential is input to a gate electrode of the third switching transistor 251c from the second control terminal 262. The third switching transistor 251c is on, and the potential of NODE_A depends on a potential input to the first terminal of the third switching transistor 251c (here, inverted potential).

Next, in a period T3_2 in the third operation period T3, a clock signal having the low potential is input to the gate electrode of the third switching transistor 251c from the second control terminal 262. The third switching transistor 251c is off, and the inverted potential is stored in NODE_A.

The fourth three-state buffer 252b in an on state inverts the potential of NODE_A input to the input terminal (inverted potential), and outputs one of the low potential and the high potential to a first terminal of the fourth switching transistor 251d connected to the output terminal.

The second inverter circuit 255b inverts a clock signal input to the second control terminal 262.

In the period T3_2, a clock signal which is the inverted signal of the clock signal having the low potential (that is, a clock signal having the high potential) is input to a gate electrode of the fourth switching transistor 251d. The fourth switching transistor 251d is on, and outputs one of the low potential and the high potential to the first terminal 271.

From the above, it is clear that one of the high potential and the low potential input to the second terminal 272 of the nonvolatile flip-flop circuit 224 is stored in the first terminal 271 in a period from the period T3_1 through the period T3_2 of the third operation period T3.

Then, in a period T3_3 and a period T3_4 in the third operation period T3, the low potential or the high potential is input to the second terminal 272 of the nonvolatile flip-flop circuit 224. The nonvolatile flip-flop circuit 224 operates in accordance with the timing chart show in FIG. 7. As a result, one of the high potential and the low potential input to the second terminal 272 of the nonvolatile flip-flop circuit 224 is stored in the first terminal 271 in a period from the period T3_3 through the period T3_4 of the third operation period T3.

In this manner, in the nonvolatile flip-flop circuit 224, a potential input to one of the first terminal 271 and the second terminal 272 later is output to the other thereof.

This embodiment can be implemented in combination with any of the other embodiments in this specification as appropriate.

Embodiment 5

In this embodiment, a semiconductor that can be applied to a semiconductor device of one embodiment of the present invention and can be used in a channel formation region of a transistor whose leakage current in an off state is extremely small will be described.

Specifically, the transistor whose channel formation region includes an oxide semiconductor and whose leakage current in an off state is extremely small, which is described in this embodiment, can be used as a switching transistor that will be described in Embodiment 6.

An oxide semiconductor has a wide energy gap of 3.0 eV or more. A transistor including an oxide semiconductor layer obtained by processing of an oxide semiconductor in an appropriate condition and a sufficient reduction in carrier density of the oxide semiconductor can have much smaller leakage current between a source and a drain in an off state (off-state current) than a conventional transistor including silicon.

<Oxide Semiconductor>

An oxide semiconductor to be used preferably contains at least indium (In) or zinc (Zn). In particular, In and Zn are preferably contained. As a stabilizer for reducing changes in electric characteristics of a transistor including the oxide semiconductor, gallium (Ga) is preferably additionally contained. Tin (Sn) is preferably contained as a stabilizer. In addition, as a stabilizer, one or more selected from hafnium (Hf), zirconium (Zr), titanium (Ti), scandium (Sc), yttrium (Y), and a lanthanoid element (such as cerium (Ce), neodymium (Nd), or gadolinium (Gd), for example) is preferably contained.

As the oxide semiconductor, for example, any of the following can be used: indium oxide, tin oxide, zinc oxide, an In—Zn-based oxide, a Sn—Zn-based oxide, an Al—Zn-based oxide, a Zn—Mg-based oxide, a Sn—Mg-based oxide, an In—Mg-based oxide, an In—Ga-based oxide, an In—Ga—Zn-based oxide (also referred to as IGZO), an In—Al—Zn-based oxide, an In—Sn—Zn-based oxide, a Sn—Ga—Zn-based oxide, an Al—Ga—Zn-based oxide, a Sn—Al—Zn-based oxide, an In—Hf—Zn-based oxide, an In—Zr—Zn-based oxide, an In—Ti—Zn-based oxide, an In—Sc—Zn-based oxide, an In—Y—Zn-based oxide, an In—La—Zn-based oxide, an In—Ce—Zn-based oxide, an In—Pr—Zn-based oxide, an In—Nd—Zn-based oxide, an In—Sm—Zn-based oxide, an In—Eu—Zn-based oxide, an In—Gd—Zn-based oxide, an In—Tb—Zn-based oxide, an In—Dy—Zn-based oxide, an In—Ho—Zn-based oxide, an In—Er—Zn-based oxide, an In—Tm—Zn-based oxide, an In—Yb—Zn-based oxide, an In—Lu—Zn-based oxide, an In—Sn—Ga—Zn-based oxide, an In—Hf—Ga—Zn-based oxide, an In—Al—Ga—Zn-based oxide, an In—Sn—Al—Zn-based oxide, an In—Sn—Hf—Zn-based oxide, and an In—Hf—Al—Zn-based oxide.

Here, an In—Ga—Zn-based oxide refers to an oxide mainly containing In, Ga, and Zn and there is no particular limitation on the ratio of In:Ga:Zn. The In—Ga—Zn-based oxide may contain a metal element other than In, Ga, and Zn.

Alternatively, a material represented by $InMO_3(ZnO)_m$, (m>0, m is not an integer) may be used as an oxide semiconductor. Note that M represents one or more metal elements selected from Ga, Fe, Mn, and Co, or the above-described element as a stabilizer. Alternatively, as the oxide semiconductor, a material represented by $In_2SnO_5(ZnO)_n$ (n>0, n is an integer) may be used.

For example, an In—Ga—Zn-based oxide with an atomic ratio of In:Ga:Zn=1:1:1, In:Ga:Zn=3:1:2, or In:Ga:Zn=2:1:3, or any of oxides whose composition is in the neighborhood of the above compositions can be used.

An oxide semiconductor film may be either single crystal or non-single-crystal.

<CAAC-OS Film>

The oxide semiconductor film is preferably a c-axis aligned crystalline oxide semiconductor (CAAC-OS) film.

With the use of the CAAC-OS film in a transistor, a change in electric characteristics of the transistor due to irradiation with visible light or ultraviolet light is small.

The CAAC-OS film is described below.

In an image obtained with a transmission electron microscope (TEM), for example, crystal parts can be found in the CAAC-OS in some cases. In most cases, in an image obtained with a TEM, crystal parts in the CAAC-OS each fit inside a cube whose one side is less than 100 nm, for example. In an image obtained with a TEM, a boundary between the crystal parts in the CAAC-OS is not clearly observed in some cases. Further, in an image obtained with a TEM, a grain boundary in the CAAC-OS is not clearly observed in some cases. In the CAAC-OS, since a clear grain boundary does not exist, for example, segregation of an impurity is unlikely to occur. In the CAAC-OS, since a clear boundary does not exist, for example, high density of defect states is unlikely to occur. In the CAAC-OS, since a clear grain boundary does not exist, for example, a reduction in electron mobility is unlikely to occur.

In each of the crystal parts included in the CAAC-OS film, for example, a c-axis is aligned in a direction parallel to a normal vector of a surface where the CAAC-OS film is formed or a normal vector of a surface of the CAAC-OS film. Further, in each of the crystal parts, metal atoms are arranged in a triangular or hexagonal configuration when seen from the direction perpendicular to the a-b plane, and metal atoms are arranged in a layered manner or metal atoms and oxygen atoms are arranged in a layered manner when seen from the direction perpendicular to the c-axis. Note that, among crystal parts, the directions of the a-axis and the b-axis of one crystal part may be different from those of another crystal part. In this specification, a term "perpendicular" includes a range from 80° to 100°, preferably from 85° to 95°. In addition, a term "parallel" includes a range from −10° to 10°, preferably from −5° to 5°.

In the CAAC-OS film, distribution of crystal parts is not necessarily uniform. For example, in the formation process of the CAAC-OS film, in the case where crystal growth occurs from a surface side of the oxide semiconductor film, the proportion of crystal parts in the vicinity of the surface of the oxide semiconductor film is higher than that in the vicinity of the surface where oxide semiconductor film is formed in some cases.

Since the c-axes of the crystal parts included in the CAAC-OS film are aligned in the direction parallel to a normal vector of a surface where the CAAC-OS film is formed or a normal vector of a surface of the CAAC-OS film, the directions of the c-axes may be different from each other depending on the shape of the CAAC-OS film (the cross-sectional shape of the surface where the CAAC-OS film is formed or the cross-sectional shape of the surface of the CAAC-OS film). Note that the direction of c-axis of the crystal part is the direction parallel to a normal vector of the surface where the CAAC-OS film is formed or a normal vector of the surface of the CAAC-OS film. The crystal portion is formed by deposition or by performing treatment for crystallization such as heat treatment after deposition.

<Method for Forming CAAC-OS Film>

There are three methods for forming a CAAC-OS film when the CAAC-OS film is used as the oxide semiconductor film.

The first method is to form an oxide semiconductor film at a temperature higher than or equal to 200° C. and lower than or equal to 450° C., whereby crystal parts in which the c-axes are aligned in the direction parallel to a normal vector of a surface where the oxide semiconductor film is formed or a normal vector of a surface of the oxide semiconductor film are formed in the oxide semiconductor film.

The second method is to form an oxide semiconductor film with a small thickness and then heat it at a temperature higher than or equal to 200° C. and lower than or equal to 700° C., whereby crystal parts in which the c-axes are aligned in the direction parallel to a normal vector of a surface where the oxide semiconductor film is formed or a normal vector of a surface of the oxide semiconductor film are formed in the oxide semiconductor film.

The third method is to form a first oxide semiconductor film with a small thickness, then heat it at a temperature higher than or equal to 200° C. and lower than or equal to 700° C., and form a second oxide semiconductor film, whereby crystal parts in which the c-axes are aligned in the direction parallel to a normal vector of a surface where the oxide semiconductor film is formed or a normal vector of a surface of the oxide semiconductor film are formed in the oxide semiconductor film.

For example, the CAAC-OS film is formed by a sputtering method using a polycrystalline oxide semiconductor sputtering target. When ions collide with the sputtering target, a crystal region included in the sputtering target may be separated from the target along an a-b plane; in other words, a sputtered particle having a plane parallel to an a-b plane (flat-plate-like sputtered particle or pellet-like sputtered particle) may flake off from the sputtering target. In that case, the flat-plate-like sputtered particle reaches a substrate while maintaining their crystal state, whereby the CAAC-OS film can be formed.

For the deposition of the CAAC-OS film, the following conditions are preferably used.

By reducing the amount of impurities entering the CAAC-OS film during the deposition, the crystal state can be prevented from being broken by the impurities. For example, the concentration of impurities (e.g., hydrogen, water, carbon dioxide, or nitrogen) which exist in a deposition chamber may be reduced. Furthermore, the concentration of impurities in a deposition gas may be reduced. Specifically, a deposition gas whose dew point is −80° C. or lower, preferably −100° C. or lower is used.

By increasing the substrate heating temperature during the deposition, migration of a sputtered particle is likely to occur after the sputtered particle reaches a substrate surface. Specifically, the substrate heating temperature during the deposition is higher than or equal to 100° C. and lower than or equal to 740° C., preferably higher than or equal to 200° C. and lower than or equal to 500° C. By increasing the substrate heating temperature during the deposition, when the flat-plate-like sputtered particle reaches the substrate, migration occurs on the substrate surface, so that a flat plane of the flat-plate-like sputtered particle is attached to the substrate.

Furthermore, it is preferable that the proportion of oxygen in the deposition gas be increased and the power be optimized in order to reduce plasma damage at the deposition. The proportion of oxygen in the deposition gas is 30 vol % or higher, preferably 100 vol %.

As an example of the sputtering target, an In—Ga—Zn—O compound target is described below.

The In—Ga—Zn—O compound target, which is polycrystalline, is made by mixing $InO_X$ powder, $GaO_Y$ powder, and $ZnO_Z$ powder in a predetermined molar ratio, applying pressure, and performing heat treatment at a temperature higher than or equal to 1000° C. and lower than or equal to 1500° C. Note that X, Y and Z are given positive numbers. Here, the predetermined molar ratio of $InO_X$ powder to $GaO_Y$ powder and $ZnO_Z$ powder is, for example, 2:2:1, 8:4:3, 3:1:1, 1:1:1, 4:2:3, or 3:1:2. The kinds of powder and the molar ratio for mixing powder may be determined as appropriate depending on the desired sputtering target.

The above is the description of the CAAC-OS film.

<Dehydration Treatment (Dehydrogenation Treatment), Oxygen Adding Treatment (Treatment for Making Oxygen-Excess State)>

After formation of the oxide semiconductor film, it is preferable that dehydration treatment (dehydrogenation treatment) be performed to remove hydrogen or moisture from the oxide semiconductor film so that the oxide semiconductor film is highly purified to contain impurities as little as possible, and that oxygen be added to the oxide semiconductor film to fill oxygen vacancies increased by the dehydration treatment (dehydrogenation treatment). In this specification and the like, supplying oxygen to an oxide semiconductor film may be expressed as oxygen adding treatment or treatment for making the oxygen content of an oxide semiconductor film be in excess of that of the stoichiometric composition may be expressed as treatment for making an oxygen-excess state.

In this manner, hydrogen or moisture is removed from the oxide semiconductor film by the dehydration treatment (dehydrogenation treatment) and oxygen vacancies therein are filled by the oxygen adding treatment, whereby the oxide semiconductor film can be turned into an i-type (intrinsic) or substantially i-type oxide semiconductor film. The oxide semiconductor film formed in such a manner contains extremely few (close to zero) carriers derived from a donor, and the carrier concentration therein is lower than $1 \times 10^{14}/cm^3$, preferably lower than $1 \times 10^{12}/cm^3$, further preferably lower than $1 \times 10^{11}/cm^3$, still further preferably lower than $1.45 \times 10^{10}/cm^3$.

The transistor including the oxide semiconductor layer which is highly purified by sufficiently reducing the hydrogen concentration, and in which defect levels in the energy gap due to oxygen vacancies are reduced by sufficiently supplying oxygen can achieve extremely excellent off-state current characteristics. For example, the off-state current (per unit channel width (1 µm) here) at room temperature (25° C.) is 100 zA (1 zA (zeptoampere) is $1 \times 10^{-21}$ A) or less, preferably 10 zA or less. The off-state current at 85° C. is 100 zA ($1 \times 10^{-19}$ A) or less, preferably 10 zA ($1 \times 10^{-20}$ A) or less. In this manner, the transistor which has extremely favorable off-state current characteristics can be obtained with the use of an i-type (intrinsic) or substantially i-type oxide semiconductor layer.

Embodiment 6

Figure 8:
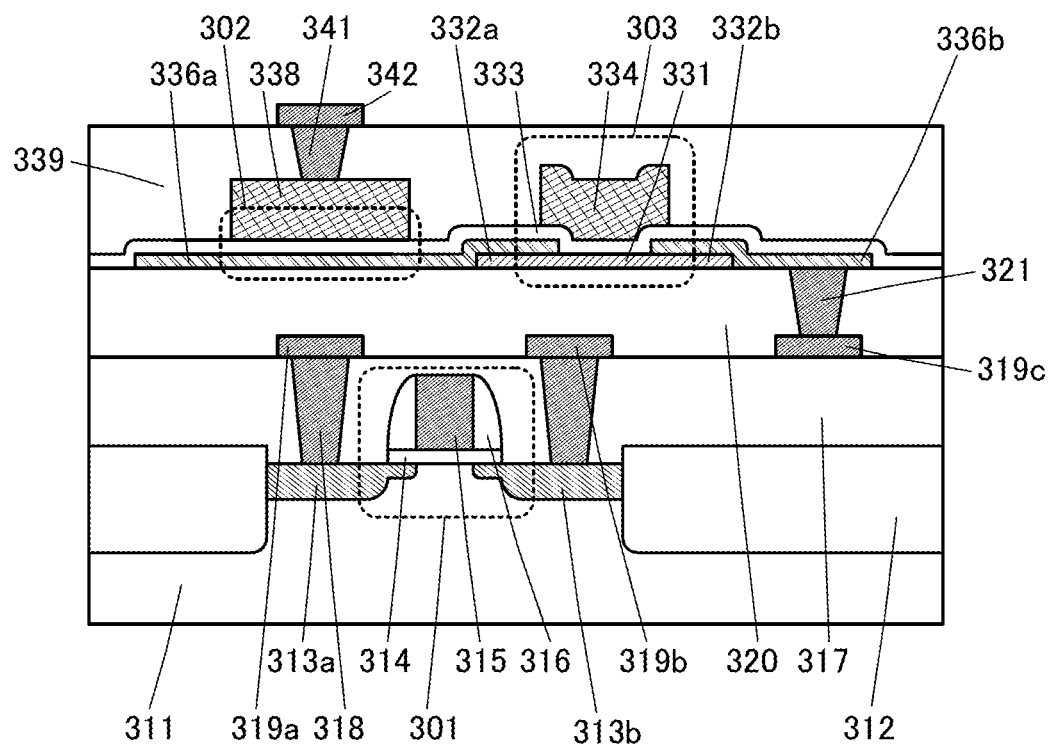
FIG. 8 illustrates the structure of a semiconductor device of an embodiment.

In this embodiment, a structure applicable to a semiconductor device of one embodiment of the present invention will be described with reference to FIG. 8. FIG. 8 is a cross-sectional view illustrating the structure of a semiconductor device of one embodiment of the present invention. Specifically, in FIG. 8, a unit memory circuit including a transistor whose leakage current in an off state is extremely small and a capacitor is provided over another circuit that is formed through a CMOS process.

Note that the transistor whose leakage current in an off state is extremely small includes the semiconductor described in Embodiment 5 in a region where a channel is formed.

In the semiconductor device illustrated in FIG. 8, the unit memory circuit including a transistor 303 whose leakage current in an off state is extremely small and a capacitor 302 is provided over a register including a transistor 301 that is formed through a CMOS process. Specifically, the transistor 301 including a semiconductor layer containing a semiconductor belonging to Group 14 of the periodic table (e.g., silicon), the transistor 303 including an oxide semiconductor layer in which a channel is formed, and the capacitor 302 are provided. Further, a semiconductor layer 311, an insulating layer 314, a conductive layer 315, an insulating layer 316, an insulating layer 317, a connection layer 318, a conductive layer 319a, a conductive layer 319b, a conductive layer 319c, an insulating layer 320, a connection layer 321, a semiconductor layer 331, an insulating layer 333, a conductive layer 334, a conductive layer 336a, a conductive layer 336b, a conductive layer 338, an insulating layer 339, a connection layer 341, and a conductive layer 342 are provided.

Note that the structure of the unit memory circuit can be applied to the nonvolatile flip-flop circuit described in Embodiment 4. Specifically, the transistor 303 whose leakage current in an off state is extremely small can be used as the switching transistor in the component circuit provided in the nonvolatile flip-flop circuit, and the capacitor 302 can be used as the capacitor connected to the B terminal of the component circuit provided in the nonvolatile flip-flop circuit.

With such a structure, even when power supply to the flip-flop circuit is stopped or interrupted, data stored in the flip-flop circuit is not lost. That is, the flip-flop circuit can function as a nonvolatile circuit. Further, since the transistor 303 and the capacitor 302 can be formed so as to overlap with another circuit (for example, the register, a first transmission path, a second transmission path, a reading/writing circuit, a control circuit, a control signal line, or the like), the area occupied by the semiconductor device can be reduced even when two or more unit memory circuits are provided.

Further, driving voltage can be reduced and an increase in power consumption can be suppressed in comparison with a structure where electric charge is held in a storage node with the use of a transistor having a floating gate.

The following describes individual components included in the semiconductor device of one embodiment of the present invention.

<<Layer Including Transistor Formed through CMOS Process>>

The semiconductor layer 311 includes a region 313a and a region 313b. In addition, adjacent transistors are electrically isolated by insulating layers 312 in some regions of the semiconductor layer 311.

For example, a semiconductor substrate can be used as the semiconductor layer 311. Alternatively, a semiconductor layer over a different substrate can be used as the semiconductor layer 311.

The region 313a and the region 313b are spaced apart from each other, and a dopant imparting n-type or p-type conductivity is added to the region 313a and the region 313b. The region 313a and the region 313b function as a source region and a drain region of an n-channel or p-channel transistor. For example, the region 313a and the region 313b are electrically connected to the conductive layer 319a and the conductive layer 319b, respectively, through the connection layers 318.

In the case where the transistor 301 is an n-channel transistor, an element imparting n-type conductivity is used as the dopant. In contrast, in the case where the transistor 301 is a p-channel transistor, an element imparting p-type conductivity is used as the dopant.

Note that low-concentration regions may be in parts of the region 313a and the region 313b. In that case, the low-concentration regions may be shallower than the rest of the region 313a and the region 313b; however, this embodiment is not limited thereto.

The insulating layer 314 is provided over a region of the semiconductor layer 311 that is between the insulating layers 312. The insulating layer 314 functions as a gate insulating layer of the transistor 301.

A layer of a material such as silicon oxide, silicon nitride, silicon oxynitride, silicon nitride oxide, aluminum oxide, aluminum nitride, aluminum oxynitride, aluminum nitride oxide, hafnium oxide, or an organic insulating material (e.g., polyimide or acrylic) can be used as the insulating layer 314, for example. The insulating layer 314 may be formed by stacking materials that can be used for the insulating layer 314.

The conductive layer 315 overlaps with the semiconductor layer 311 with the insulating layer 314 provided therebetween. A region of the semiconductor layer 311 that overlaps with the conductive layer 315 is a channel formation region of the transistor 301. The conductive layer 315 functions as a gate of the transistor 301.

A layer of a metal material such as molybdenum, magnesium, titanium, chromium, tantalum, tungsten, aluminum, copper, neodymium, or scandium or an alloy material containing the metal material as a main component can be used as the conductive layer 315, for example. The conductive layer 315 may be formed by stacking materials that can be used for the conductive layer 315.

The insulating layers 316 are provided over the insulating layer 314 and in contact with a pair of side surfaces of the conductive layer 315 that face each other.

The insulating layer 317 is provided over the conductive layer 315 and the insulating layers 316.

Each of the insulating layers 316 and 317 can be formed using any of the materials that can be used for the insulating layer 314, which may be the same as or different from the material used for the insulating layer 314. Alternatively, the insulating layers 316 or the insulating layer 317 can be formed by stacking materials that can be used for the insulating layers 316 and 317.

The connection layers 318 are provided to fill openings in the insulating layer 317 and are electrically connected to the region 313a and the region 313b.

The conductive layer 319a, the conductive layer 319b, and the conductive layer 319c are provided over the insulating layer 317. The conductive layer 319a is electrically connected to the region 313a through the connection layer 318. The conductive layer 319b is electrically connected to the region 313b through the connection layer 318. The conductive layer 319c is electrically connected to the conductive layer 315 through the connection layer 318 (not illustrated).

Each of the connection layer 318, the conductive layer 319a, the conductive layer 319b, and the conductive layer 319c can be formed using any of the materials that can be used for the conductive layer 315, which may be the same as or different from the material used for the conductive layer 315.

Alternatively, each of the connection layer 318, the conductive layer 319a, the conductive layer 319b, and the conductive layer 319c can be formed by stacking materials that can be used for the connection layer 318, the conductive layer 319a, the conductive layer 319b, and the conductive layer 319c.

The insulating layer 320 is provided over the insulating layer 317, the conductive layer 319a, the conductive layer 319b, and the conductive layer 319c. The structure of the insulating layer 320 can be similar to that of the insulating layer 317.

The connection layer 321 is provided to fill an opening in the insulating layer 320 and is electrically connected to the conductive layer 319c. The structure of the connection layer 321 can be similar to that of the connection layer 318.

<<Layer Including Transistor Whose Leakage Current in Off State is Extremely Small and Capacitor>>

The semiconductor layer 331 is provided over the insulating layer 320. For the semiconductor layer 331, the semiconductor described in Embodiment 5 can be used.

A region to which a dopant is added may be provided for regions of the semiconductor layer 331 which overlap with the conductive layer 336a and the conductive layer 336b. One or more selected from the following can be used as the dopant: Group 15 elements (typical examples thereof are nitrogen (N), phosphorus (P), arsenic (As), and antimony (Sb)), boron (B), aluminum (Al), argon (Ar), helium (He), neon (Ne), indium (In), fluorine (F), chlorine (Cl), titanium (Ti), and zinc (Zn). Note that such a region is not necessarily provided.

The conductive layer 336a and the conductive layer 336b are spaced apart from each other and electrically connected to each other while being in contact with the semiconductor layer 331. The conductive layer 336a and the conductive layer 336b function as a source electrode and a drain electrode of a transistor. The conductive layer 336b is electrically connected to the connection layer 321. The conductive layer 336a also functions as one of electrodes of the capacitor 302.

The conductive layers 336a and 336b can be formed using a metal selected from aluminum (Al), chromium (Cr), copper (Cu), tantalum (Ta), titanium (Ti), molybdenum (Mo), tungsten (W), neodymium (Nd), scandium (Sc), and the like; an alloy containing the above metal element; an alloy containing the above metal elements in combination; a nitride of the above metal element; or the like. Further, one or more metal elements selected from manganese (Mn), magnesium (Mg), zirconium (Zr), beryllium (Be), and the like may be used.

The insulating layer 333 is provided over the semiconductor layer 331, the conductive layer 336a, and the conductive layer 336b. The insulating layer 333 functions as a gate insulating layer of the transistor. The insulating layer 333 also functions as a dielectric layer of the capacitor 302.

The insulating layer 333 can be formed using, for example, a single layer or a stacked layer using a material selected from aluminum nitride, aluminum oxide, aluminum nitride oxide, aluminum oxynitride, silicon nitride, silicon oxide, silicon nitride oxide, silicon oxynitride, tantalum oxide, and lanthanum oxide.

When a high-k material such as hafnium silicate ($HfSiO_x$), hafnium silicate to which nitrogen is added ($HfSi_xO_yN_z$), hafnium aluminate to which nitrogen is added ($HfAl_xO_yN_z$), hafnium oxide, or yttrium oxide is used as the insulating layer 333, gate leakage can be reduced by increasing the physical thickness of a gate insulating film without changing the substantial thickness (e.g., equivalent silicon oxide thickness) of the gate insulating film. Further, a stacked structure can be used in which a high-k material and one or more of silicon oxide, silicon nitride, silicon oxynitride, silicon nitride oxide, aluminum oxide, aluminum oxynitride, and gallium oxide are stacked.

The conductive layer 334 overlaps with the semiconductor layer 331 with the insulating layer 333 provided therebetween. The conductive layer 334 functions as a gate of the transistor. Further, it is preferable that the conductive layer 334 be provided so as to partially overlap with the conductive layers 336a and 336b.

The conductive layer 334 can be formed using a metal selected from aluminum (Al), chromium (Cr), copper (Cu), tantalum (Ta), titanium (Ti), molybdenum (Mo), tungsten (W), neodymium (Nd), and scandium (Sc); an alloy containing the above metal element; an alloy containing the above metal elements in combination; a nitride of the above metal element; or the like. Further, one or more metal elements selected from manganese (Mn), magnesium (Mg), zirconium (Zr), beryllium (Be), and the like may be used.

In addition, the conductive layer 334 may have a single-layer structure or a stacked structure of two or more layers. For example, a single-layer structure of aluminum containing silicon, a two-layer structure in which titanium is stacked over aluminum, a two-layer structure in which titanium is stacked over titanium nitride, a two-layer structure in which tungsten is stacked over titanium nitride, a two-layer structure in which tungsten is stacked over tantalum nitride, a two-layer structure in which Cu is stacked over a Cu—Mg—Al alloy, a three-layer structure in which titanium, aluminum, and titanium are stacked in this order, and the like can be given.

Alternatively, for the conductive layer 334, a light-transmitting conductive material such as indium tin oxide, indium oxide containing tungsten oxide, indium zinc oxide containing tungsten oxide, indium oxide containing titanium oxide, indium tin oxide containing titanium oxide, indium zinc oxide, or indium tin oxide to which silicon oxide is added can be used. It is also possible to employ a stacked structure including the light-transmitting conductive material and the metal element.

Gallium oxide, indium gallium zinc oxide containing nitrogen, indium tin oxide containing nitrogen, indium gallium oxide containing nitrogen, indium zinc oxide containing nitrogen, tin oxide containing nitrogen, indium oxide containing nitrogen, or a metal nitride (e.g., InN or ZnN) may overlap with the conductive layer 334 and the semiconductor layer 331 and be in contact with the conductive layer 334 and the insulating layer 333.

These materials each have a work function of 5 eV or higher, preferably 5.5 eV or higher. When a layer formed using any of these materials is provided so as to overlap with the semiconductor layer 331 with the insulating layer 333 provided therebetween, the threshold voltage of the transistor can be positive. Accordingly, a so-called normally-off switching element can be obtained. For example, in the case where In—Ga—Zn—O containing nitrogen is used, In—Ga—Zn—O having higher nitrogen concentration than at least the semiconductor layer 331, specifically, In—Ga—Zn—O having a nitrogen concentration of 7 atomic percent or higher is used.

The conductive layer 338 is provided over the conductive layer 336a with the insulating layer 333 provided therebetween.

Here, the capacitor 302 is formed using the conductive layer 336a, the insulating layer 333, and the conductive layer 338.

The insulating layer 339 is provided over the insulating layer 333 and the conductive layers 334 and 338.

A material that is similar to the material of the insulating layer 317 can be used for the insulating layer 339.

The connection layer 341 is provided to fill an opening in the insulating layer 339 and is electrically connected to the conductive layer 338.

The structure of the connection layer 341 can be similar to that of the connection layer 318.

The conductive layer 342 is provided over the insulating layer 339. The conductive layer 342 is electrically connected to the conductive layer 338 through the connection layer 341.

The structure of the conductive layer 342 can be similar to those of the conductive layer 319a, the conductive layer 319b, and the conductive layer 319c.

This embodiment can be implemented in combination with any of the other embodiments in this specification as appropriate.

This application is based on Japanese Patent Application serial no. 2012-125993 filed with Japan Patent Office on Jun. 1, 2012, and Japanese Patent Application serial no. 2013-010751 filed with Japan Patent Office on Jan. 24, 2013, the entire contents of which are hereby incorporated by reference.

What is claimed is:

1. A semiconductor device comprising:
a first register; and
a second register comprising a first flip-flop circuit and a second flip-flop circuit,
wherein the first register is electrically connected to the first flip-flop circuit,
wherein the first flip-flop circuit is electrically connected to the second flip-flop circuit,
wherein each of the first flip-flop circuit and the second flip-flop circuit comprises a first transistor and a capacitor,
wherein the first transistor comprises a channel formation region comprising an oxide semiconductor,
wherein a first terminal of the first transistor is electrically connected to a first terminal of the capacitor,
wherein each of the first flip-flop circuit and the second flip-flop circuit comprises a first three-state buffer,
wherein an output of the first three-state buffer is electrically connected to a second terminal of the first transistor,
wherein each of the first flip-flop circuit and the second flip-flop circuit comprises a second transistor and a second three-state buffer,
wherein the second transistor comprises a channel formation region comprising an oxide semiconductor,
wherein a first terminal of the second transistor is electrically connected to an input of the first three-state buffer,
wherein a second terminal of the second transistor is electrically connected to an output of the second three-state buffer, and
wherein an input of the second three-state buffer is electrically connected to the first terminal of the capacitor.

2. The semiconductor device according to claim 1,
wherein each of the first flip-flop circuit and the second flip-flop circuit is a nonvolatile flip-flop circuit.

3. The semiconductor device according to claim 1,
wherein the first register is electrically connected to the input of the first three-state buffer and the first terminal of the second transistor of the first flip-flop circuit, and
wherein the first terminal of the capacitor of the first flip-flop circuit is electrically connected to the input of the first three-state buffer and the first terminal of the second transistor of the second flip-flop circuit.

4. The semiconductor device according to claim 3,
wherein the first register is configured to hold first data,
wherein the first flip-flop circuit is configured to hold second data output from the first register,
wherein the second flip-flop circuit is configured to hold third data output from the first flip-flop circuit,
wherein the first register is configured to output the first data to the first flip-flop circuit in a first period,
wherein the first flip-flop circuit is configured to store the first data and output the second data to the second flip-flop circuit in the first period, and
wherein the second flip-flop circuit is configured to store the second data in the first period.

5. The semiconductor device according to claim 4,
wherein the second flip-flop circuit is configured to output the second data to the first flip-flop circuit in a second period after the first period,
wherein the first flip-flop circuit is configured to store the second data and output the first data to the first register in the second period, and
wherein the first register is configured to store the first data in the second period.

6. A semiconductor device comprising:
a first register;
a second register comprising a first flip-flop circuit and a second flip-flop circuit; and
an external memory device,
wherein the first register is electrically connected to the first flip-flop circuit,
wherein the first flip-flop circuit is electrically connected to the second flip-flop circuit,
wherein the second flip-flop circuit is electrically connected to the external memory device,
wherein each of the first flip-flop circuit and the second flip-flop circuit comprises a first transistor and a capacitor,
wherein the first transistor comprises a channel formation region comprising an oxide semiconductor,
wherein a first terminal of the first transistor is electrically connected to a first terminal of the capacitor,
wherein each of the first flip-flop circuit and the second flip-flop circuit comprises a first three-state buffer,
wherein an output of the first three-state buffer is electrically connected to a second terminal of the first transistor,
wherein each of the first flip-flop circuit and the second flip-flop circuit comprises a second transistor and a second three-state buffer,
wherein the second transistor comprises a channel formation region comprising an oxide semiconductor,
wherein a first terminal of the second transistor is electrically connected to an input of the first three-state buffer,
wherein a second terminal of the second transistor is electrically connected to an output of the second three-state buffer, and
wherein an input of the second three-state buffer is electrically connected to the first terminal of the capacitor.

7. The semiconductor device according to claim 6,
wherein each of the first flip-flop circuit and the second flip-flop circuit is a nonvolatile flip-flop circuit.

8. The semiconductor device according to claim 6,
wherein the first register is electrically connected to the input of the first three-state buffer and the first terminal of the second transistor of the first flip-flop circuit,
wherein the first terminal of the capacitor of the first flip-flop circuit is electrically connected to the input of the first three-state buffer and the first terminal of the second transistor of the second flip-flop circuit, and
wherein the first terminal of the capacitor of the second flip-flop circuit is electrically connected to the external memory device.

9. The semiconductor device according to claim 8,
wherein the first register is configured to hold first data,
wherein the first flip-flop circuit is configured to hold second data output from the first register,
wherein the second flip-flop circuit is configured to hold third data output from the first flip-flop circuit,
wherein the first register is configured to output the first data to the first flip-flop circuit in a first period,
wherein the first flip-flop circuit is configured to store the first data and output the second data to the second flip-flop circuit in the first period, and
wherein the second flip-flop circuit is configured to store the second data and output the third data to the external memory device in the first period.

10. The semiconductor device according to claim 9,
wherein the second flip-flop circuit is configured to output the second data to the first flip-flop circuit in a second period after the first period,
wherein the first flip-flop circuit is configured to store the second data and output the first data to the first register in the second period, and
wherein the first register is configured to store the first data in the second period.

11. A semiconductor device comprising:
a first register;
a second register comprising a first flip-flop circuit and a second flip-flop circuit; and
a memory access determination circuit,
wherein the first register is electrically connected to the first flip-flop circuit,
wherein the first flip-flop circuit is electrically connected to the second flip-flop circuit,
wherein each of the first flip-flop circuit and the second flip-flop circuit comprises a first transistor, a capacitor, and a first three-state buffer,
wherein the first transistor comprises a channel formation region comprising an oxide semiconductor,
wherein a first terminal of the first transistor is electrically connected to a first terminal of the capacitor,
wherein an output of the first three-state buffer is electrically connected to a second terminal of the first transistor, and
wherein the memory access determination circuit is configured to monitor data written to the second register from the first register, and output a wait signal before the data is written to the second register when the volume of the data exceeds the capacity of the second register.

12. The semiconductor device according to claim 11,
wherein each of the first flip-flop circuit and the second flip-flop circuit is a nonvolatile flip-flop circuit.

13. The semiconductor device according to claim 12,
wherein each of the first flip-flop circuit and the second flip-flop circuit comprises a second transistor and a second three-state buffer,
wherein the second transistor comprises a channel formation region comprising an oxide semiconductor,
wherein a first terminal of the second transistor is electrically connected to an input of the first three-state buffer,
wherein a second terminal of the second transistor is electrically connected to an output of the second three-state buffer, and
wherein an input of the second three-state buffer is electrically connected to the first terminal of the capacitor.

14. The semiconductor device according to claim 13,
wherein the first register is electrically connected to the input of the first three-state buffer and the first terminal of the second transistor of the first flip-flop circuit, and wherein the first terminal of the capacitor of the first flip-flop circuit is electrically connected to the input of the first three-state buffer and the first terminal of the second transistor of the second flip-flop circuit.

15. The semiconductor device according to claim 14,
wherein the first register is configured to hold first data,
wherein the first flip-flop circuit is configured to hold second data output from the first register,
wherein the second flip-flop circuit is configured to hold third data output from the first flip-flop circuit,
wherein the first register is configured to output the first data to the first flip-flop circuit in a first period,
wherein the first flip-flop circuit is configured to store the first data and output the second data to the second flip-flop circuit in the first period, and
wherein the second flip-flop circuit is configured to store the second data in the first period.

16. The semiconductor device according to claim 15,
wherein the second flip-flop circuit is configured to output the second data to the first flip-flop circuit in a second period after the first period,
wherein the first flip-flop circuit is configured to store the second data and output the first data to the first register in the second period, and
wherein the first register is configured to store the first data in the second period.

* * * * *